(12) United States Patent
Nakai et al.

(10) Patent No.: US 8,304,792 B2
(45) Date of Patent: Nov. 6, 2012

(54) SEMICONDUCTOR LIGHT EMITTING APPARATUS AND OPTICAL PRINT HEAD

(75) Inventors: Yusuke Nakai, Hachioji (JP); Hironori Furuta, Hachioji (JP); Mitsuhiko Ogihara, Hachioji (JP); Hiroyuki Fujiwara, Hachioji (JP)

(73) Assignee: Oki Data Corporation, Tokyo (JP)

( * ) Notice: Subject to any disclaimer, the term of this patent is extended or adjusted under 35 U.S.C. 154(b) by 0 days.

(21) Appl. No.: 12/347,144

(22) Filed: Dec. 31, 2008

(65) Prior Publication Data
US 2009/0242904 A1    Oct. 1, 2009

(30) Foreign Application Priority Data

Mar. 26, 2008  (JP) ................... 2008-080907
Dec. 11, 2008  (JP) ................... 2008-315630

(51) Int. Cl.
*H01L 33/02*    (2010.01)
(52) U.S. Cl. .................. 257/94; 257/E33.048
(58) Field of Classification Search .......... 257/88, 257/94, E33.048, E33.044; 438/22, 34, 39
See application file for complete search history.

(56) References Cited

U.S. PATENT DOCUMENTS

| | | | |
|---|---|---|---|
| 3,757,174 A | | 9/1973 | Shigemasa et al. |
| 4,829,357 A | * | 5/1989 | Kasahara ................ 257/113 |
| 5,084,748 A | * | 1/1992 | Kasahara et al. ........ 257/432 |
| 5,340,998 A | * | 8/1994 | Kasahara ................. 257/13 |
| 6,222,208 B1 | * | 4/2001 | Ogihara et al. .......... 257/101 |
| 6,563,138 B2 | * | 5/2003 | Ogihara et al. ........... 257/88 |
| 6,881,978 B2 | * | 4/2005 | Ogihara .................. 257/79 |
| 7,009,221 B2 | * | 3/2006 | Ohno ..................... 257/107 |
| 2004/0081216 A1 | * | 4/2004 | Dehmubed et al. ...... 372/50 |
| 2007/0075330 A1 | * | 4/2007 | Ogihara et al. .......... 257/134 |

FOREIGN PATENT DOCUMENTS

EP    1770781 A2    4/2007

(Continued)

OTHER PUBLICATIONS

European Search Report for the European Application No. 08173099.6 dated May 3, 2010.

*Primary Examiner* — Hsien Ming Lee
*Assistant Examiner* — Michele Fan
(74) *Attorney, Agent, or Firm* — Panitch Schwarze Belisario & Nadel LLP

(57) ABSTRACT

A semiconductor light emitting apparatus is supplied capable of providing a high performance that can optimize simultaneously both an electrical characteristic and a light emitting characteristic. The semiconductor apparatus comprises an anode layer; a cathode layer that has a conductive type different from that of the anode layer; a gate layer that controls an electrical conduction between the anode layer and the cathode layer; an active layer that is set between the anode layer and the cathode layer and emits light through recombination of electron and positive hole; a first cladding layer that is set on one surface of the active layer and has an energy band gap larger than that of the active layer; and a second cladding layer that is set on other surface of the active layer, has an energy band gap larger than that of the active layer and has a conductive type different from that of the first cladding layer, wherein a thickness of the gate layer is or below a mean free path of carriers implanted into the gate layer.

2 Claims, 31 Drawing Sheets

FOREIGN PATENT DOCUMENTS

| | | | |
|---|---|---|---|
| JP | 2288273 A | | 11/1990 |
| JP | 04079274 A | * | 3/1992 |
| JP | 8153890 A | | 6/1996 |
| JP | 2001-068726 A | | 3/2001 |
| JP | 2006216726 A | | 8/2006 |
| JP | 2007081081 A | | 3/2007 |
| JP | 2007096160 A | | 4/2007 |
| JP | 2008060227 A | * | 3/2008 |

* cited by examiner

SEMICONDUCTOR LIGHT EMITTING APPARATUS AND OPTICAL PRINT HEAD

FIELD OF THE INVENTION

The present invention relates to a semiconductor apparatus and an optical print head that have a light emitting function.

BACKGROUND OF THE INVENTION

Patent document 1 publicized a semiconductor element with a light emitting function. As shown in FIG. 31 patent document 1 publicized such semiconductor element with a thyristor structure, comprising layers of p-type first layer "312", p-type second layer "314", n-type third layer "316", p-type fourth layer "318", n-type fifth layer "320" and n-type sixth layer "322".

In the semiconductor element, a semiconductor material layer is set so that: during "ON" state when the current passing from anode to cathode, minority carriers implanted through a forward pn junction emit light and recombine. Thus, it is possible to form a 3-terminal light emitting element in "ON" state.

It may refer to patent document 1 of Japan patent publication 2001-68726.

In the 3-terminal light emitting element with such structure mentioned above, however, in order to enable the thyristor to operate well, minority carriers implanted into a gate layer are desired to pass through the gate layer without recombining vigorously. Further, in a light emitting operation, the minority carriers implanted into an active layer should be closed in this layer to improve a carrier density so as to enable the light emitting operation to be more efficient.

In order to close carriers into the active layer, besides setting an energy barrier on a semiconductor layer interface that contacts the active layer, a semiconductor layer with a certain thickness still needs to be set. However, the setting mentioned above is just contrary to that the minority carriers pass through the gate layer without recombining vigorously. Thereby, it fails to improve gate control performance.

Therefore, it is difficult for a conventional 3-terminal light emitting element to optimize simultaneously both an electrical characteristic and a light emitting characteristic.

SUMMARY OF THE INVENTION

It is, therefore, an object of the invention to provide an image forming apparatus and an image forming system capable of solving the above problem. That is, the invention has an objective to provide a semiconductor apparatus, an optical print head and an image forming apparatus with high performance that can optimize simultaneously both the electrical characteristic and light emitting characteristic.

A first aspect of the invention is to provide a semiconductor light emitting apparatus, it comprises an anode layer; a cathode layer that has a conductive type different from that of the anode layer; a gate layer that controls an electrical conduction between the anode layer and the cathode layer; an active layer that is set between the anode layer and the cathode layer and emits light through recombination of electron and positive hole; a first cladding layer that is set on one surface of the active layer and has an energy band gap larger than that of the active layer; and a second cladding layer that is set on other surface of the active layer, has an energy band gap larger than that of the active layer and has a conductive type different from that of the first cladding layer, wherein a thickness of the gate layer is or below a mean free path of carriers implanted into the gate layer.

Moreover, a second aspect of the invention is also to provide a semiconductor light emitting apparatus, it comprises a gate layer; an anode region in which impurity with a conductive type different from that of the gate layer diffuses selectively from one surface of the gate layer to the inside of the gate layer; a cathode layer that has a conductive type different from that of the anode region; an active layer that is set between the anode region and the cathode layer; a first cladding layer that is set on one surface of the active layer and has an energy band gap larger than that of the active layer; and a second cladding layer that is set on other surface of the active layer, has an energy band gap larger than that of the active layer and has a conductive type different from that of the first cladding layer, wherein a distance between front of the impurity diffused in the anode region and the other surface of the gate layer is or below a mean free path of carriers implanted into the gate layer.

Further, a third aspect of the invention is to provide an optical print head, it comprises a semiconductor light emitting apparatus array that is composed of plural semiconductor light emitting apparatuses; a drive circuit that drives the semiconductor light emitting apparatus array; and a substrate that loads the semiconductor light emitting apparatus array and the drive circuit, wherein the semiconductor light emitting apparatus includes an anode layer; a cathode layer that has a conductive type different from that of the anode layer; a gate layer that controls an electrical conduction between the anode layer and the cathode layer; an active layer that is set between the anode layer and the cathode layer and emits light through recombination of electron and positive hole; a first cladding layer that is set on one surface of the active layer and has an energy band gap larger than that of the active layer; and a second cladding layer that is set on other surface of the active layer, has an energy band gap larger than that of the active layer and has a conductive type different from that of the first cladding layer, wherein a thickness of the gate layer is or below a mean free path of carriers implanted into the gate layer.

Furthermore, a fourth aspect of the invention is to provide an image forming apparatus, it comprises an optical print head; and an image forming section that forms an image through an exposure of the optical print head, wherein the optical print head comprise a semiconductor light emitting apparatus array that is composed of plural semiconductor light emitting apparatuses; a drive circuit that drives the semiconductor light emitting apparatus array; and a substrate that loads the semiconductor light emitting apparatus array and the drive circuit, wherein the semiconductor light emitting apparatus includes an anode layer; a cathode layer that has a conductive type different from that of the anode layer; a gate layer that controls an electrical conduction between the anode layer and the cathode layer; an active layer that is set between the anode layer and the cathode layer and emits light through recombination of electron and positive hole; a first cladding layer that is set on one surface of the active layer and has an energy band gap larger than that of the active layer; and a second cladding layer that is set on other surface of the active layer, has an energy band gap larger than that of the active layer and has a conductive type different from that of the first cladding layer, wherein a thickness of the gate layer is or below a mean free path of carriers implanted into the gate layer.

EFFECT OF THE INVENTION

According to the invention, gate control performance for performing semiconductor operation has not a big influence on a light emitting efficiency; vice versa, a semiconductor layer structure capable of improving light emitting characteristic also has not a big influence on the gate control performance. Consequently, it is possible to realize a semiconductor apparatus with high performance that can optimize simultaneously both an electrical characteristic and a light emitting characteristic.

The above and other objects and features of the present invention will become apparent from the following detailed description and the appended claims with reference to the accompanying drawings.

DETAILED DESCRIPTION OF THE PREFERRED EMBODIMENTS

Embodiments of the invention will be described in detail hereinbelow with reference to the drawings, with respect to a 3-terminal light emitting element used for a semiconductor light emitting apparatus in the present invention.

Embodiment 1

Figure 1:
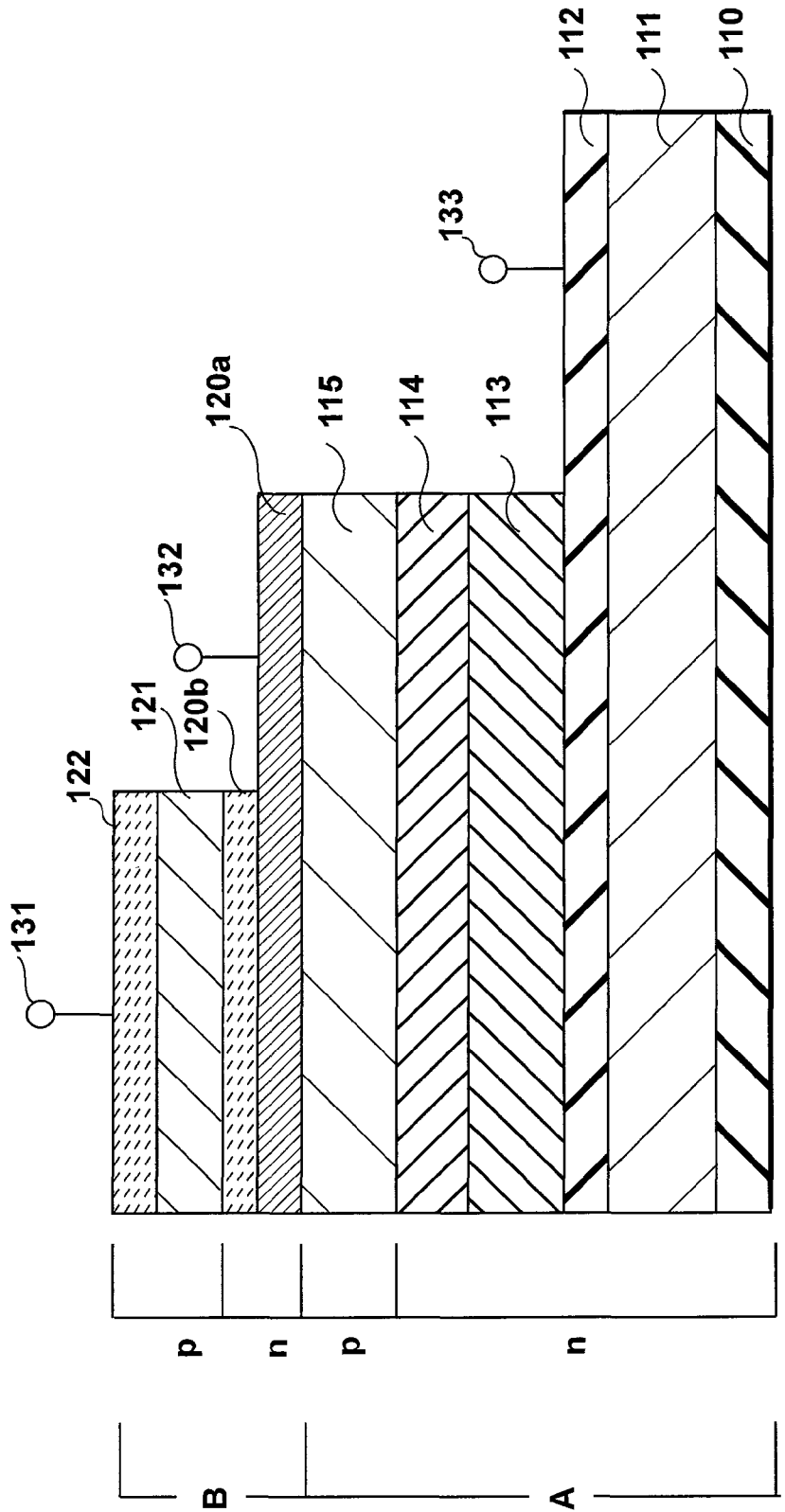
FIG. 1 is a cross-sectional view showing a semiconductor layer structure of a 3-terminal light emitting element in Embodiment 1 of the present invention.

FIG. 1 is a cross-sectional view showing a semiconductor layer structure of a 3-terminal light emitting element in Embodiment 1 of the present invention.

A semiconductor thin layer in the present embodiment can be obtained when a semiconductor layer completes being exfoliated from the parent material substrate for crystal growth.

As shown in FIG. 1 semiconductor thin layers consist of two regions: region A and region B.

Region A mainly refers to a region including semiconductor layers with a light emitting function and region B mainly refers to a region including semiconductor layers with the gate control performance; "110" represents a junction layer; "111" represents a cathode conduction layer; "112" represents a cathode contact layer; "113" represents a bottom cladding layer; "114" represents an active layer; "115" represents a top cladding layer; "120a" represents a gate contact layer; "120b" represents a gate conduction layer; "121" represents an anode conduction layer; and "122" represents an anode contact layer. Further, "131" represents an anode electrode; "132" represents a gate electrode; and "133" represents a cathode electrode.

Semiconductor materials used to form the semiconductor layers can be such nitride semiconductor materials as InP-series semiconductor material, AlGaAs-series semiconductor material, InGaAlP-series semiconductor material, GaN-series semiconductor material or the like.

Semiconductor layer structures formed by the AlGaAs-series semiconductor material are illustrated hereinafter one by one.

As shown in FIG. 1, junction layer "110" is formed by a n-type GaAs layer; cathode conduction layer "111" is formed by a n-type $Al_sGa_{1-s}As$ layer; cathode contact layer "112" is formed by a n-type GaAs layer; bottom cladding layer "113" is formed by a $Al_xGa_{1-x}As$ layer; active layer "114" is formed by a n-type $Al_yGa_{1-y}As$ layer; top cladding layer "115" is formed by a p-type $Al_zGa_{1-z}As$ layer; gate contact layer "120a" is formed by a n-type GaAs layer; gate conduction layer "120b" is formed by a n-type $Al_gGa_{1-g}As$ layer; anode conduction layer "121" is formed by a p-type $Al_rGa_{1-r}As$ layer; and anode contact layer 122 is formed by a p-type GaAs layer.

Besides the semiconductor layers mentioned above, in order to expose all contact layers an InGap layer or the like can be set on a contact layer as an etching stop layer.

In the structure mentioned above, a gross thickness of gate contact layer "120a" and gate conduction layer "120b" should be very thinner (below 200 nm for instance), and allows minority carriers (also positive holes) to pass the gate layer. In addition, impurity density of gate conduction layer "120b" should be very low (below $1 \times 10^{17}$ $cm^{-3}$), so as to enable minority carriers implanted into the layer to pass through this layer.

The requirements of gate layer including gate contact layer "120a" and gate conduction layer "120b" are illustrated hereinafter.

A thickness of gate layer should be smaller than a mean free path of positive holes implanted through a pn junction formed by a p-type anode conduction layer "121" and a n-type gate conduction layer "120b". A mean free path of minority carriers refers to a diffusion distance of carriers in their lifetime (also called diffusion length).

It is assumed that lifetime of carriers is $\tau$, diffusion coefficient is D, then, the above-stated diffusion distance L (diffusion length) can be calculated according to the following expression (1):

$$L = \sqrt{(\tau D)} \quad (1)$$

When a thickness of the gate layer mentioned above is larger than a mean free path (diffusion length) of minority carriers implanted, as minority carriers in the gate layer recombine increasingly and the current passed between anode and gate increases, the current passed between anode and cathode will decrease. As a result of that, carriers implanted into an active layer recombine less and light emitting efficiency will drop dramatically. In this condition, it is difficult to control a light emitting status by a gate voltage.

The correlation between the thickness of the gate layer and the mean free path can be illustrated hereinafter through some specific values.

The gate layer formed by a n-type $Al_xGa_{1-x}As$ layer (also gate conduction layer 120b) with a low doping density (electron density: $1 \times 10^{17}$ $cm^{-3}$) and that formed by a n-type GaAs layer (also gate contact layer 120a) with high doping density (electron density: $5 \times 10^{18}$ $cm^{-3}$) are illustrated hereinafter as examples.

In the example the cases of Al mixture crystal ratio (x=0.15) mentioned above being the same with that in an active layer and Al mixture crystal ratio (x=0.4) mentioned above being larger than that in an active layer are illustrated.

Further, the reason for taking a gate contact layer with high doping density as an example is that the high doping density enables the contact resistance of the gate electrode to be reduced.

The correlation between a diffusion distance (Lp) of minority carriers (positive holes) implanted into a n-type GaAs layer and the electron density (Ne) is described in expression as follows:

$Ne(GaAs-1) = 5 \times 10^{18}$ $cm^{-3}$, $Lp(GaAs-1) = 0.3$ μm;

$Ne(GaAs-2) = 1 \times 10^{17}$ $cm^{-3}$, $Lp(GaAs-2) = 4.2$ μm.

Data of diffusion length in GaAs layer mentioned above can be used to calculate diffusion length in $Al_xGa_{1-x}As$.

A diffusion coefficient D depends on a movement degree of carriers. Further, when $Al_xGa_{1-x}As$ series semiconductor material is used the diffusion coefficient D decreases with the increase of Al mixture crystal ratio (x).

It is supposed that when Al mixture crystal ratio (x) x=0, x=0.15, x=0.4 the corresponding diffusion coefficients are $D_0$, $D_{0.15}$ and $D_{0.4}$ respectively, then the values of $\eta_{0.15}$ ($D_{0.15}/D_0$) and $\eta_{0.4}$ ($D_{0.4}/D_0$) are $\eta_{0.15=0.8}$ and $\eta_{0.4}=0.06$ respectively.

Further, a lifetime of carriers ($\tau$) depends on the product of majority carrier density and minority carrier density; if compares in a same density, carriers have a same lifetime. The lifetime of carrier ($\tau$) depends on Al mixture ratio (x).

When x=0, x=0.15, x=0.4, their corresponding lifetimes are $\tau_0$, $\tau_{0.15}$ and $\tau_{0.4}$ respectively. And values of $\chi_{0.15}$ ($\tau_{0.15}/\tau_0$) and $\chi_{0.4}$ ($\tau_{0.4}/\tau_0$) are: $\chi_{0.15}=0.1$ and $\chi_{0.4}=0.01$ respectively.

On the basis of the results mentioned above, the expression (1) can be used to calculate diffusion length Lp(x: 0.15), wherein Al mixture crystal ratio x=0.15 and Lp(x: 0.4), wherein Al mixture crystal ratio x=0.4.

$$Lp(x: 0.15) = Lp(GaAs - 2) \times \sqrt{(\eta_{0.15} \times x_{0.15})}$$
$$= 4.2 \, [\mu m] \times \sqrt{(0.8 \times 0.1)}$$
$$\approx 1.2 \, [\mu m]$$

$$Lp(x: 0.4) = Lp(GaAs - 2) \times \sqrt{(\eta_{0.4} \times x_{0.4})}$$
$$= 4.2 \, [\mu m] \times \sqrt{(0.06 \times 0.01)}$$
$$\approx 0.1 \, [\mu m]$$

On the basis of the results calculated above, when the gate layer comprises a gate contact layer formed by a GaAs layer with electron density being $5 \times 10^{18}$ $cm^{-3}$ and a gate conduction layer formed by a $Al_{0.15}Ga_{0.85}As$ layer with electron density being $1 \times 10^{17}$ $cm^{-3}$, a thickness of gate layer should at least be smaller than the sum of diffusion length of minority carriers in gate contact layer and that of minority carriers in gate conduction layer.

For instance a thickness of each layer can be set to be the half of a diffusion length in the layer, that is, a thickness of contact layer formed by a GaAs layer=Lp(GaAs-1)/2=0.15 μm; and a thickness of conduction layer formed by an $Al_{0.15}Ga_{0.85}As$ layer=Lp(x: 0.15)/2=0.6 μm.

In addition, when gate layer comprises a gate contact layer formed by GaAs layer with an electron density being $5 \times 10^{18}$ $cm^{-3}$ and a gate conduction layer formed by $Al_{0.4}Ga_{0.6}As$ layer with an electron density being $1 \times 10^{17}$ $cm^{-3}$, a thickness of the gate layer should at least be smaller than the sum of diffusion length of minority carriers in the gate contact layer and that of minority carriers in the gate conduction layer.

For instance, a thickness of each layer can be set to be the half of diffusion length in the layer, that is, a thickness of contact layer formed by a GaAs layer=Lp(GaAs-1)/2=0.15 μm; and a thickness of conduction layer formed by a $Al_{0.4}Ga_{0.6}As$ layer=Lp(x: 0.4)/2=0.05 μm.

The Al mixture crystal ratio of all layers, x, y, z, s, t should at least meet the following condition: x, z, s, t>y.

When x, z>y, carriers implanted into an active layer can be closed in it; when s, t>y, other wavelengths can be prevented from being excited due to light emitting.

As for g, it is better to meet the expression: g≦y. When g=y even though only part of minority carriers implanted into a gate layer recombine, a wavelength of light emitted because of recombining of carriers will also be equal to that of light emitted from an active layer. Consequently as a light emitting element, a narrow wavelength distribution enables it to obtain a favorable light emitting characteristic.

In addition, as semiconductor layer of g selects its value in an indirect semiconductor material region, even though part of the minority carriers implanted into the gate layer recombine the light will not be emitted. Therefore as a light emitting element, a narrow wavelength distribution allows a favorable light emitting characteristic.

As an example, structures of semiconductor layers formed by nitride-series semiconductor materials are illustrated hereinafter.

As shown in FIG. 1, junction layer "110" is formed by a n-type GaN layer or AlN/GaN layer; cathode conduction layer "111" is formed by a n-type $Al_sGa_{1-s}N$ layer; cathode contact layer "112" is formed by a n-type GaN layer; bottom cladding layer "113" is made of a n-type GaN layer; active layer "114" is formed by a n-type $In_yGa_{1-y}N$ layer; top cladding layer "115" is formed by a p-type GaN layer; gate contact layer "120a" is formed by n-type GaN layer; gate conduction layer "120b" is formed by a n-type $Al_gGa_{1-g}N$ layer; anode conduction layer "121" is formed by a p-type $Al_rGa_{1-r}N$ layer; and anode contact layer "122" is formed by a p-type GaN layer.

Further, bottom cladding layer "113" and top cladding layer "115" can be formed by a layer containing $Al_rGa_{1-r}N$ layer. Active layer "114" can be used as a multiplex quantum well layer [GaN/$In_yGa_{1-y}N$].

The conditions of nitride-series gate layer are illustrated in detail hereinafter.

Here, as an example, cases of gate layer formed by a n-type GaN layer and that formed by a p-type GaN layer are illustrated to show the thickness of the nitride-series gate layer.

Diffusion length of the positive holes in n-type GaN layer Lp(GaN) is 0.28 μm and diffusion length of electrons in p-type GaN layer Le(GaN) is 0.2 μm.

Here, if a thickness of the gate layer is also supposed to be half of diffusion length as above, when the gate layer is formed by a n-type GaN layer, it is assumed that a thickness of gate layer formed by n-type GaN=Lp(GaN)/2=0.14 μm.

In addition, when the gate layer is formed by a p-type GaN, it is assumed that a thickness of gate layer formed by p-type GaN=Le(GaN)/2=0.1 μm.

As an example, constituents of semiconductor layers formed by AlGaInP series semiconductor materials are illustrated hereinafter:

As shown in FIG. 1, junction layer "110" is formed by a n-type GsAs layer; cathode conduction layer "111" is formed by a n-type $(Al_xGa_{1-x})_yIn_{1-y}P$ layer; cathode contact layer "112" is formed by a n-type GaAs layer; bottom cladding layer "113" is formed by a $(Al_xGa_{1-x})_yIn_{1-y}P$ layer; active layer "114" is formed by a n-type $In_yGa_{1-y}P$ layer; top cladding layer "115" is formed by a p-type $(Al_xGa_{1-x})_yIn_{1-y}P$ layer; gate contact layer "120a" is formed by a n-type GaAs layer; gate conduction layer "120b" is formed by a n-type GaAs layer; anode conduction layer "121" is formed by a p-type $(Al_xGa_{1-x})_yIn_{1-y}P$ layer; and anode contact layer "122" is formed by a p-type GaAs layer. Further, active layer "114" can be a multiplex quantum well layer formed by InGaP.

Figure 2:
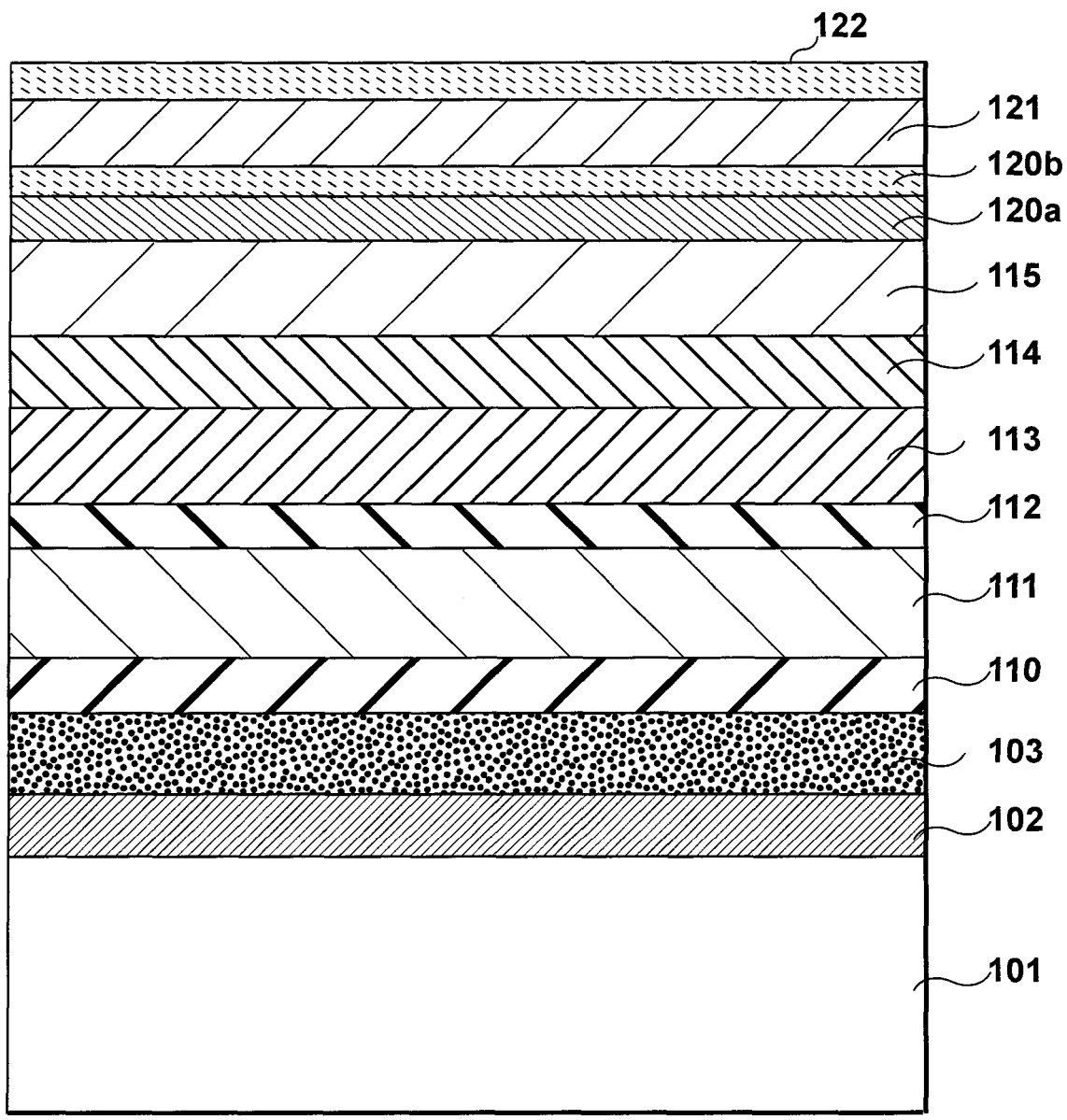
FIG. 2 is a cross-sectional view showing a structure of a semiconductor thin layer shown in FIG. 1 after being exfoliated from a growth substrate.

FIG. 2 is a cross-sectional view showing a structure of a semiconductor thin layer shown in FIG. 1 after being exfoliated from a growth substrate. Here the exfoliation of semiconductor thin layer when using the AlGaAs series semiconductor material as semiconductor thin layer GaAs substrate, is illustrated hereinafter.

As shown in FIG. 2, "101" represents a GaAs substrate used as a growth substrate; "102" represents a GaAs layer used as a buffer layer allowing the epitaxial growth of a semiconductor thin layer; "103" represents a $Al_pGa_{1-p}As$ layer used as an etching layer allowing a semiconductor thin layer being exfoliated from a GaAs substrate 101, for example, a AlAs layer (when p=1).

GaAs substrate 101 as shown in FIG. 2 is mesa etched to a desired size and forms an island shape pattern. When etching layer 103 is exposed through mesa etching, the support body used to support semiconductor thin layer is formed appropriately. Then the etching layer 103 is etched selectively in order to enable the island shape part to be exfoliated from GaAs substrate 101. The semiconductor thin layer exfoliated from GaAs substrate 101 can be joined to other substrates through an intermolecular force or the like.

Figure 3:
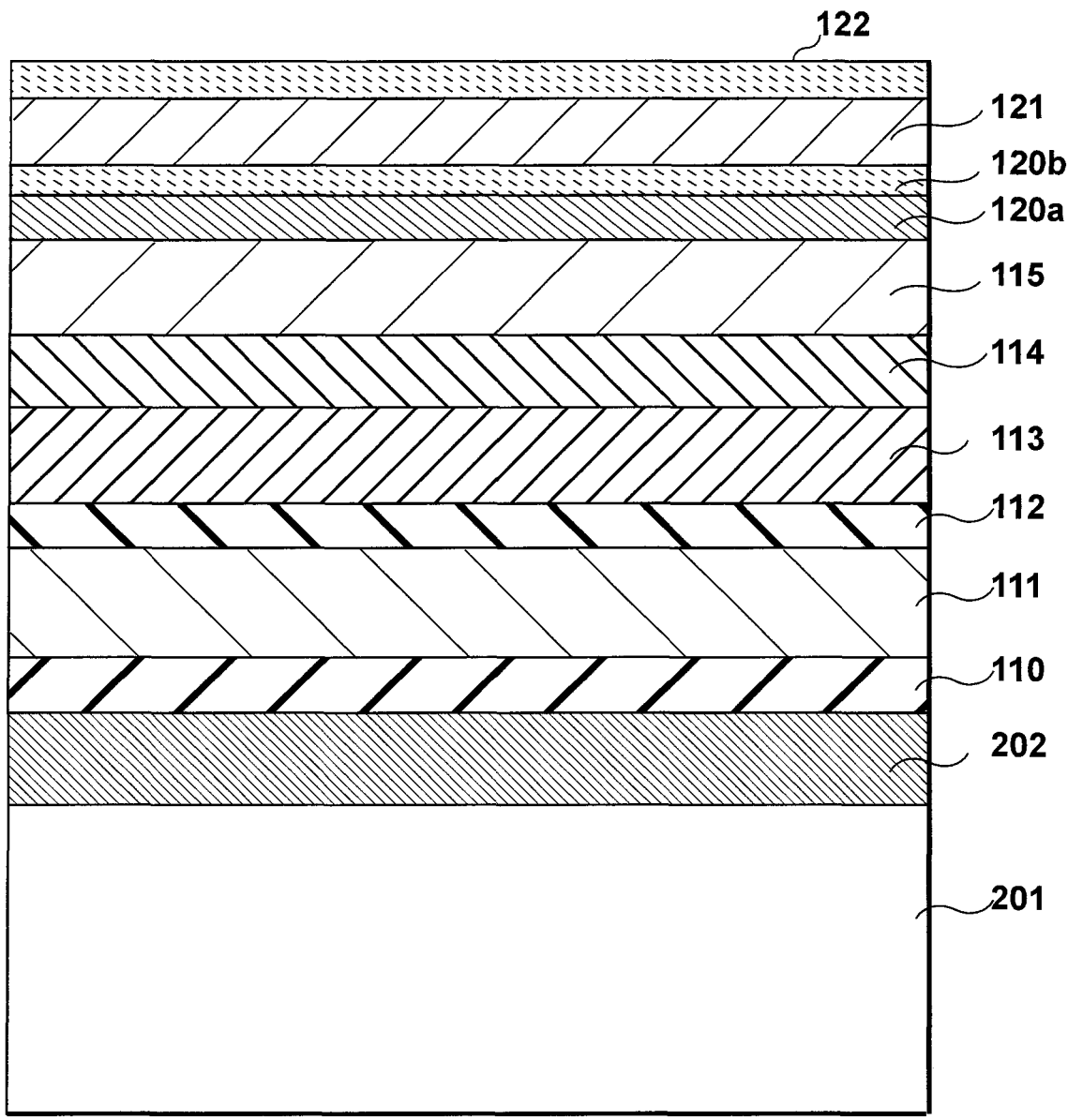
FIG. 3 is a cross-sectional view showing a shape of a semiconductor thin layer joining to a heterogeneous substrate.

FIG. 3 is a cross-sectional view showing the shape of a semiconductor thin layer joining to a heterogeneous substrate.

Heterogeneous substrate 201 can be formed by a Si substrate, IC substrate, glass substrate, ceramic substrate, plastic substrate, metal substrate or the like. As shown in FIG. 3, "202" represents another material layer set between substrate 201 and semiconductor thin layer, a planarization layer used to make the surface of substrate 201 planar.

Figure 4:
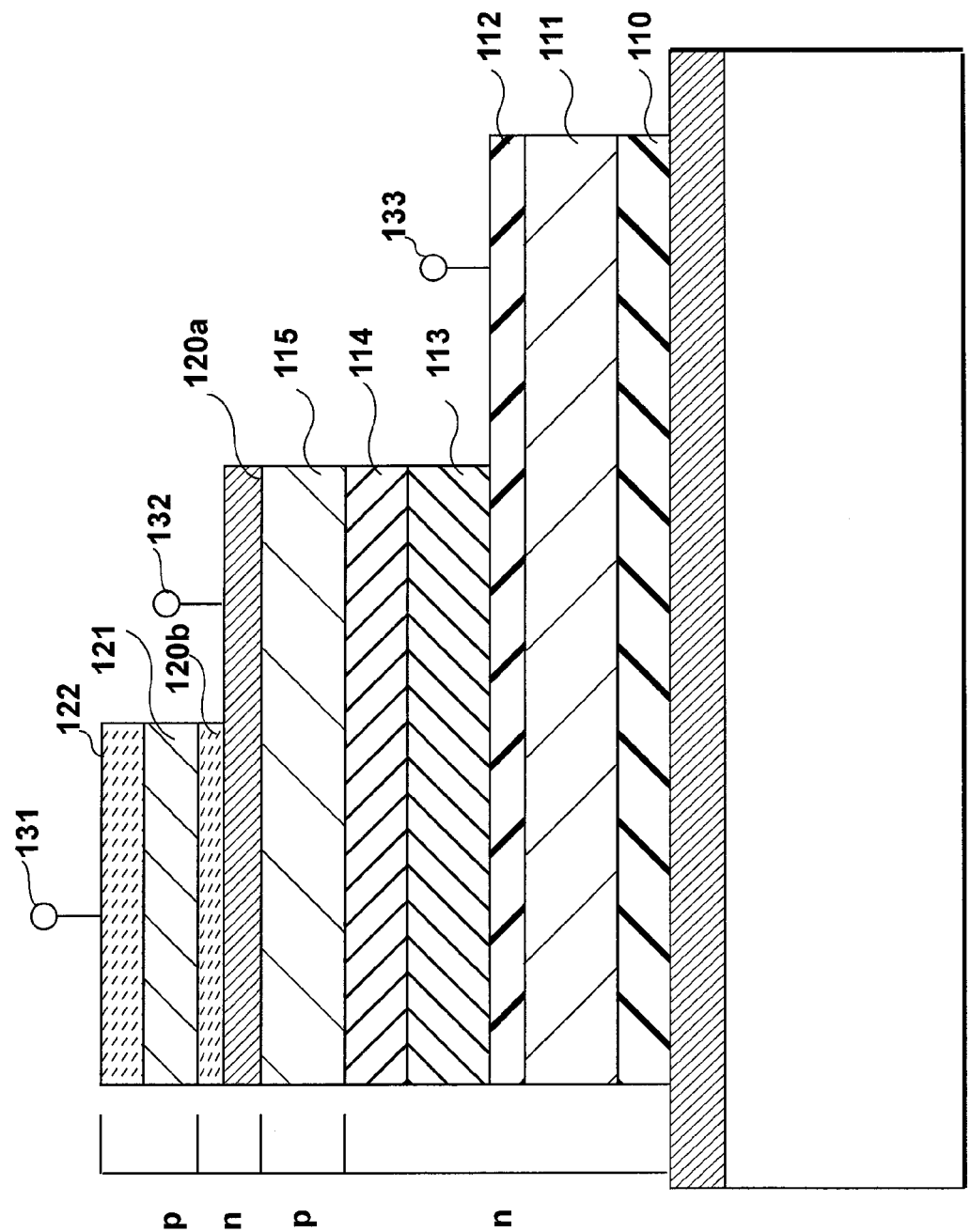
FIG. 4 is a cross-sectional view showing a 3-terminal light emitting element in Embodiment 1.

After semiconductor thin layer joining to a heterogeneous substrate 201, through a separation to individual elements and a photolithographic etching to formation patterns of cathode contact layer, gate contact layer or anode contact layer of all elements, a 3-terminal light emitting element shown in FIG. 4 can be fabricated.

Figure 5:
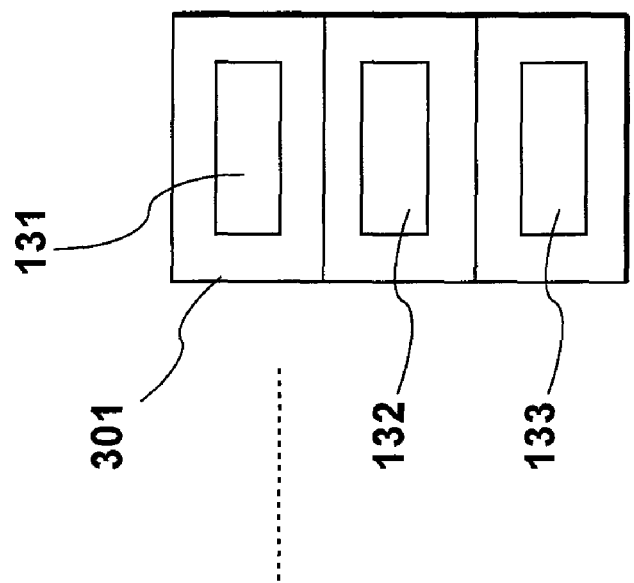
FIG. 5 is a plan view showing a one-dimensional 3-terminal light emitting element array.
Figure 6:
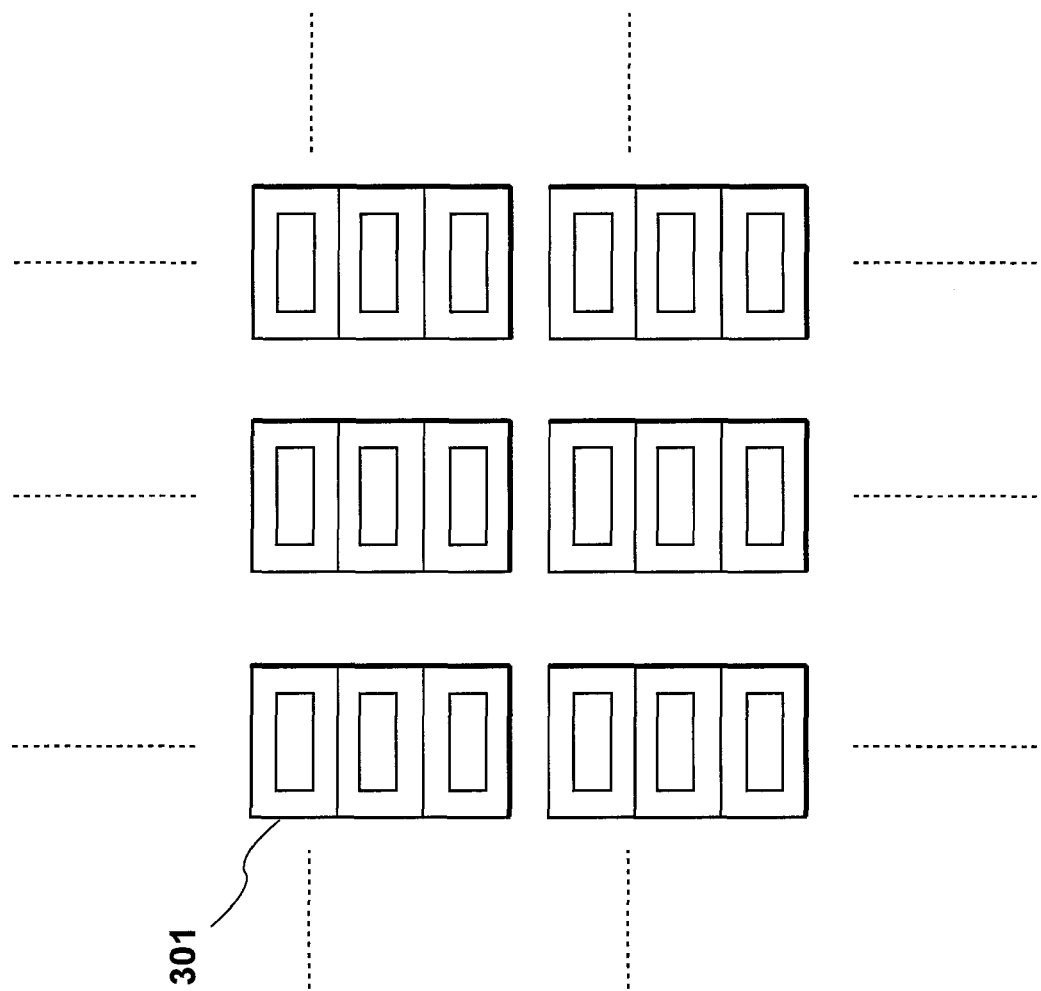
FIG. 6 is a plan view showing a two-dimensional 3-terminal light emitting element array.

As shown in FIG. 5, a 3-terminal light emitting element array can be formed after the one-dimensional array to several 3-terminal light emitting elements shown in FIG. 4. In FIG. 5 constituents that are the same with those shown in figures (from FIG. 1 to FIG. 4) will be marked with a same symbol. Further, as shown in FIG. 6, 3-terminal light emitting element 301 can also be arrayed in two dimensions.

Figure 7:
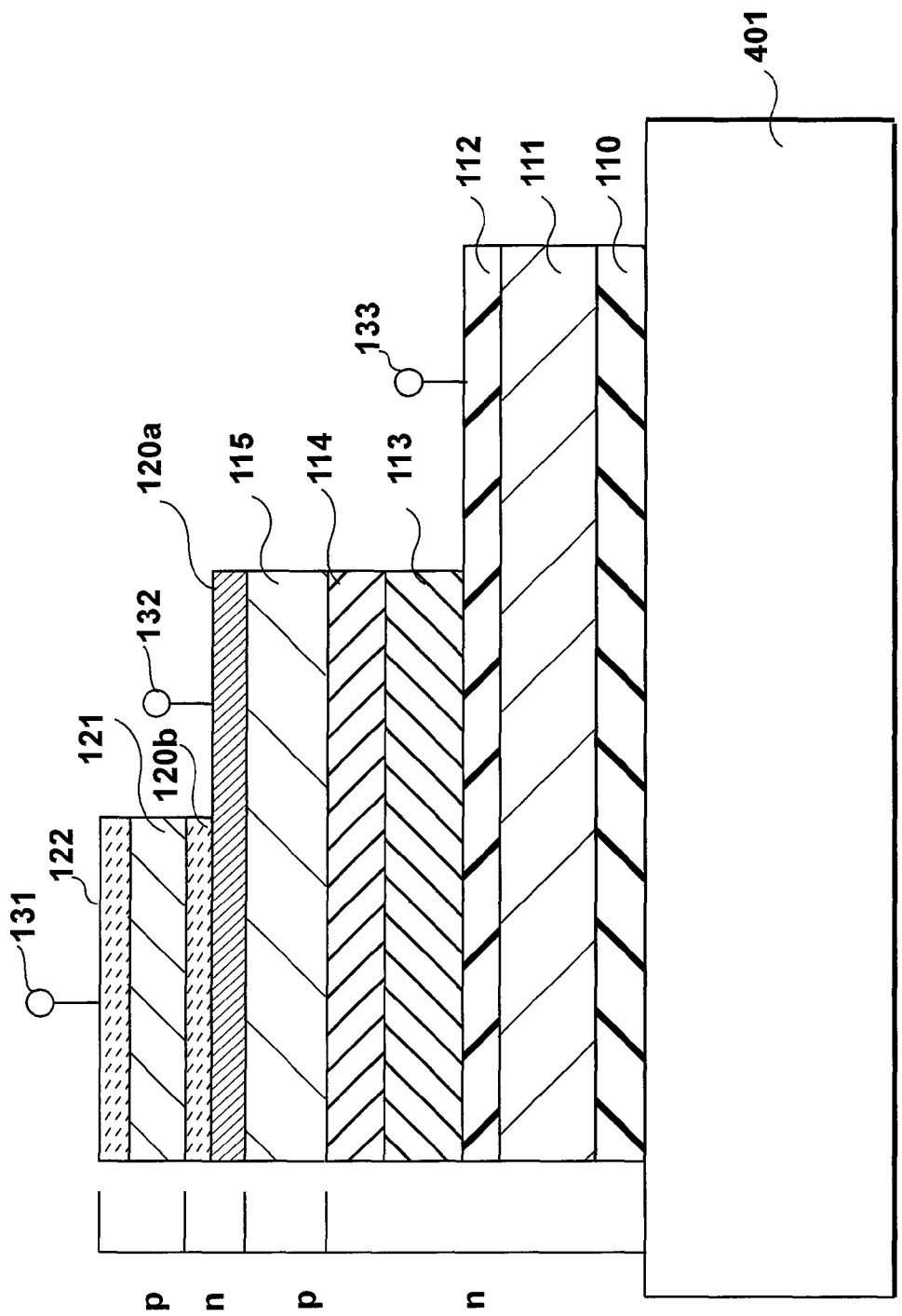
FIG. 7 is a cross-sectional view showing a 3-terminal light emitting element different from that shown in FIG. 4.

In figures (from FIG. 2 to FIG. 4), a shape of semiconductor thin layer joining to a heterogeneous substrate is illustrated. Further, as shown in FIG. 7, the semiconductor thin layer can also not be exfoliated from a growth substrate 401 allowing it to exist in growth substrate 401 directly.

The operation of 3-terminal light emitting element in Embodiment 1 is illustrated hereinafter.

As shown in FIG. 1, it is assumed that anode electrode 131 is plus potential; cathode electrode 133 is potential which is in a minus direction of an anode voltage, ground potential for instance; and gate electrode 132 is plus potential.

When a potential correlation between anode electrode and gate electrode is in adverse bias, a pn junction formed between gate contact layer 120a and top cladding layer 115 is also in the adverse bias potential and there is no current passed between the anode and cathode. When an anode voltage rises and is over gate voltage, a forward characteristic between anode electrode and gate electrode is intensified and carriers implanted into gate contact layer 120a are accelerated and amplified. Therefore, pn junction formed between the gate contact layer 120a and top cladding layer 115 has no way to maintain an adverse bias potential and all junctions formed between anode and cathode turn to be forward operation and then there is higher current passed between anode electrode 131 and cathode electrode 133.

In this state, diffusion of carriers implanted from top cladding layer 115 is stopped by an energy barrier of bottom cladding layer 113. And at the same time, diffusion of electrons is stopped by an energy barrier of top cladding layer 115 and high-density carriers are closed in active layer 114 for recombining more efficiently and emitting light.

To apply a plus potential to a gate electrode 132 and apply a plus voltage to an anode electrode 131 until 3-terminal light emitting element not shift to "ON" level. In this state, to lower a potential of gate electrode 132 and carriers are implanted forwardly between anode electrode and gate electrode and then pn junction between gate contact layer 210a and top cladding layer turn to be forward and 3-terminal light emitting element shifts its state from "OFF" to "ON".

A contact layer 120a and a conduction layer 120b with low doping density are used to form a n-type gate layer. Through making its gross thickness thinner, carriers can recombine less in gate layer and current mainly passes from anode to cathode. Therefore, carriers mainly recombine efficiently in active layer 114 to obtain a 3-terminal light emitting element with a relatively higher light emitting efficiency.

In Embodiment 1 of the present invention mentioned above, there are: active layer 114; cladding layer 115 that set on top of active layer and has a conductive type different from that of active layer; cladding layer 113 that set under active layer and has a conductive type different from that of active layer; cathode contact layer 112 that set on bottom cladding layer 113 with a conductive type 1 and used for conduction; gate contact layer 120a with a conductive type 1 set on top of top cladding layer 115 with a conductive type 2; and gate layer that is formed by gate conduction layer 120b and gate conduction layer 120a with a low density and whose band gaps being larger than or equal to that of active layer 114, wherein a thickness of gate layer should be at least not larger than a mean free path of minority carriers implanted. Anode conduction layer 121 and anode contact layer 122 that have band gaps being larger than or equal to that of active layer 114 are set on the gate contact layer 120a. In a 3-terminal light emitting element with the structure mentioned above, a gate control performance for an operation of 3-terminal light emitting element will not have major effect on a light emitting efficiency; vice versa, a semiconductor layer structure with higher light emitting characteristic will also not have major effect on a gate control performance. In this way, a 3-terminal light emitting element that can optimize simultaneously an electrical characteristic and a light emitting characteristic can be achieved.

Especially in a gate layer that formed by at least two layers and forms pn junction its band-gap energy is equal to that of an active layer. Therefore, a wavelength of light emitted through recombining of the carriers implanted into a gate layer can be set equal to that emitted from an active layer so as to obtain a 3-terminal light emitting element with a narrow wavelength distribution and a superior light emitting characteristic.

In addition, in an gate layer that formed by at least two layers and forms pn junction its band-gap energy is formed selectively through an indirect transfer and a recombination of minority carriers implanted into an gate layer turns to be non-light emitting recombination so as to obtain a 3-terminal light emitting element with a narrow wavelength distribution and a superior light emitting characteristic.

The transformation example of the 3-terminal light emitting element in Embodiment 1 is illustrated hereinafter, series on the figures (From FIG. 8 to FIG. 13).

Figure 8:
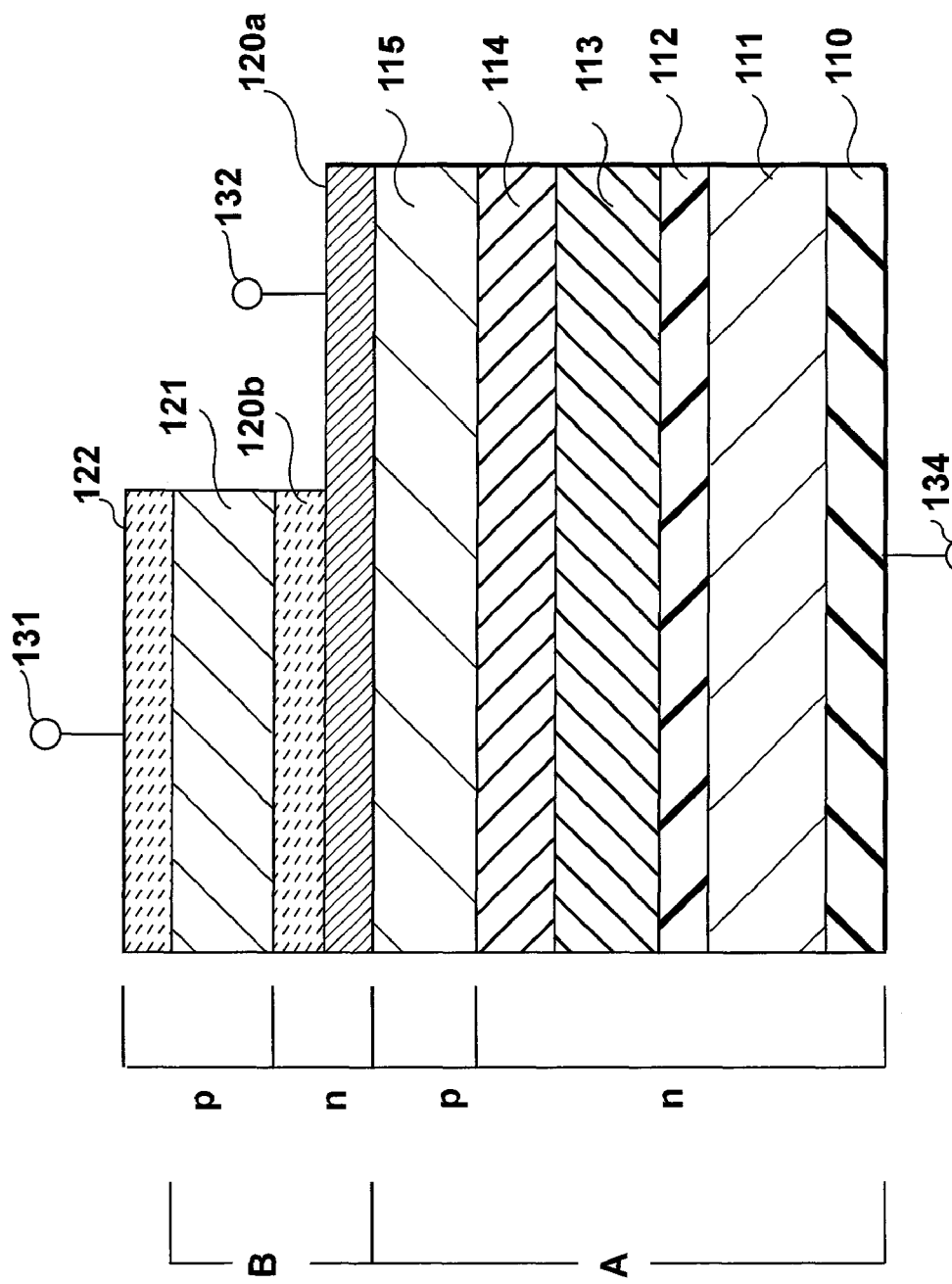
FIG. 8 is a cross-sectional view showing a transformation example (1) in Embodiment 1.
Figure 9:
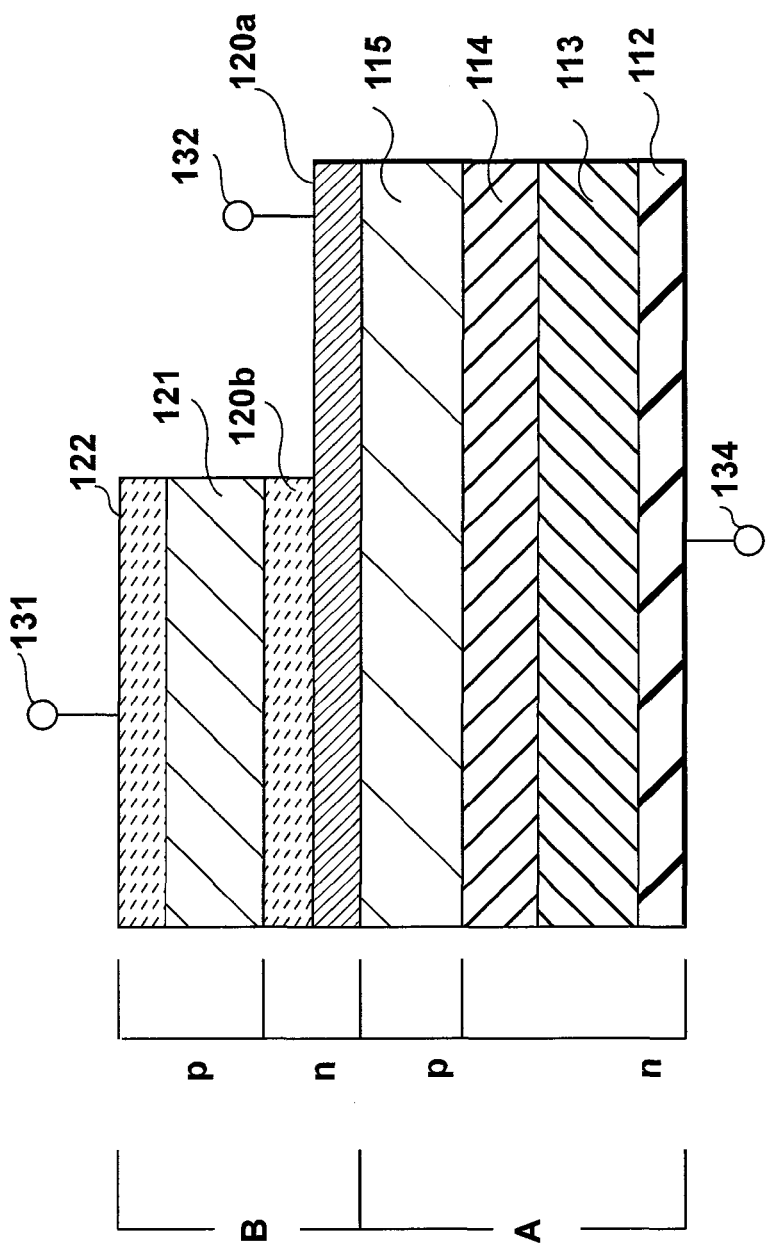
FIG. 9 is a cross-sectional view showing a transformation example (2) in Embodiment 1.

Transformation example (1) is shown in FIG. 8. In Transformation example (1), the cathode electrode 134 is not set above the semiconductor thin layer, but in its inner face. On this condition, as shown in transformation example (2), the cathode conduction layer 111 and junction layer 110 can be omitted, using the cathode contact layer 112 instead, also as a junction layer.

Figure 10:
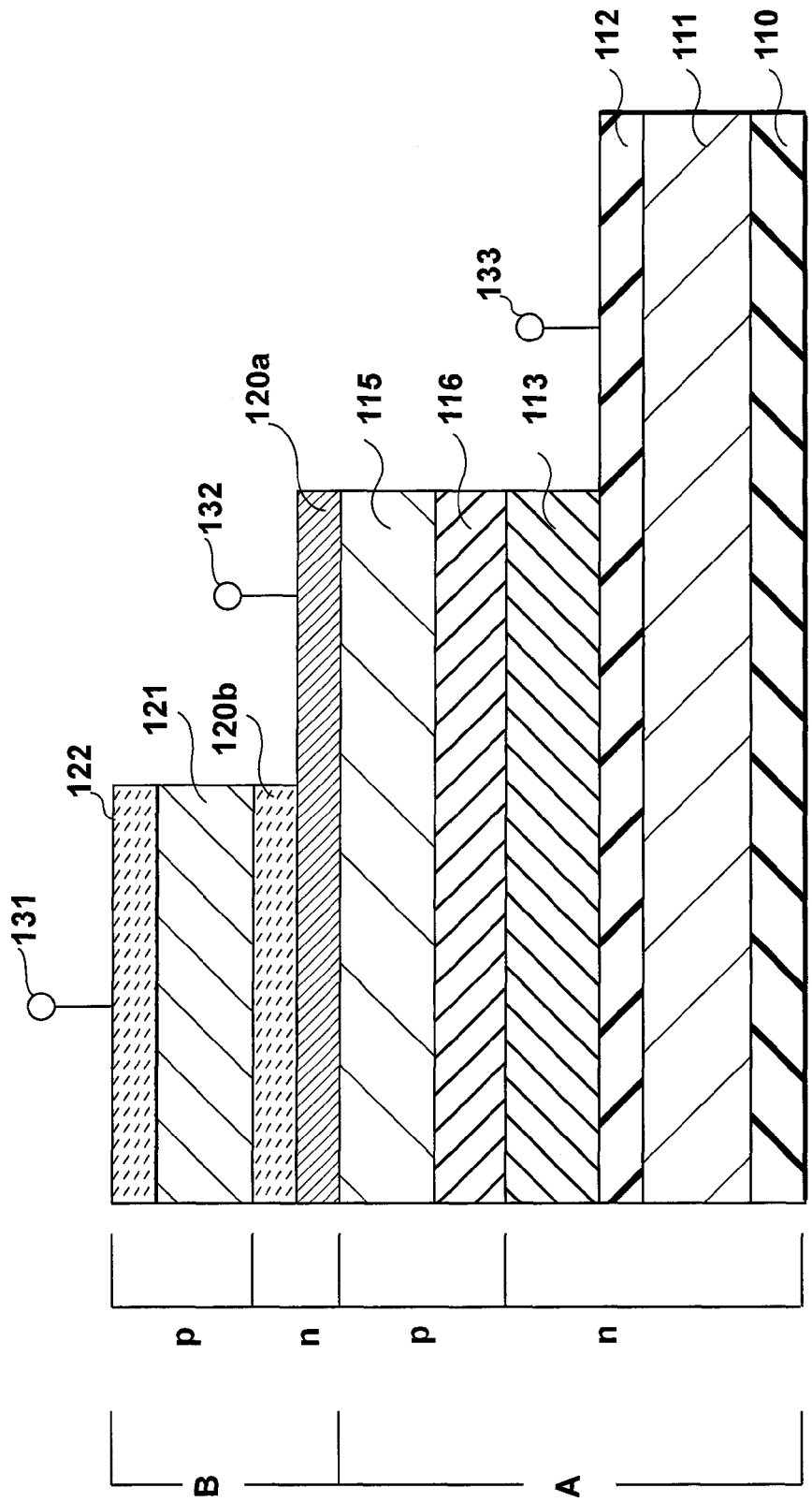
FIG. 10 is a cross-sectional view showing a transformation example (3) in Embodiment 1.

The transformation example (3) is shown in FIG. 10. In transformation example (3) p-type active layer 116 is used instead of n-type Active layer 114.

Figure 11:
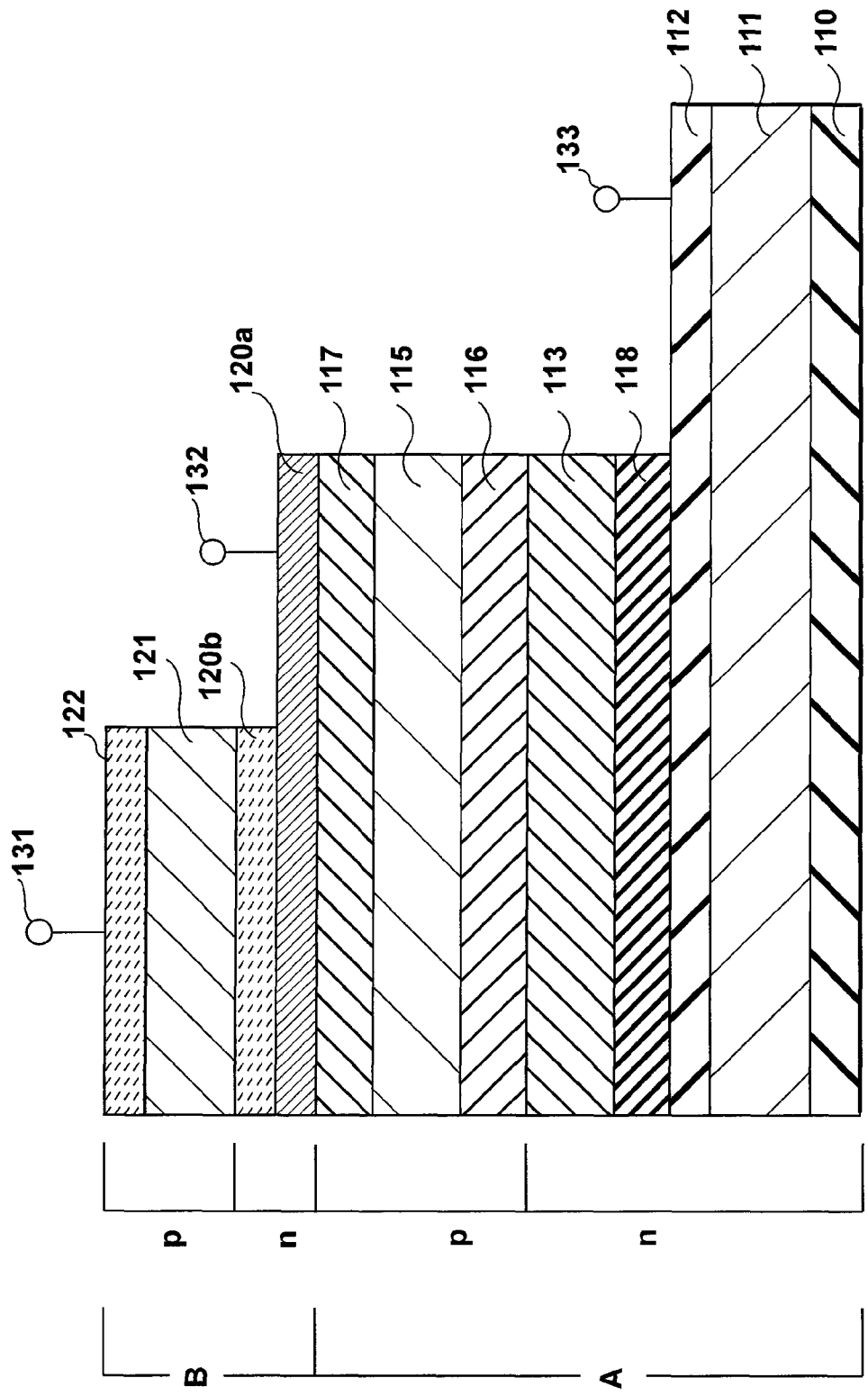
FIG. 11 is a cross-sectional view showing a transformation example (4) in Embodiment 1.

The transformation example (4) is shown in FIG. 11. In transformation example (4), the semiconductor layer 117 is added to the upper layer of top cladding layer 115 and semiconductor layer 118 is added to the under layer of the bottom layer 113.

Figure 12:
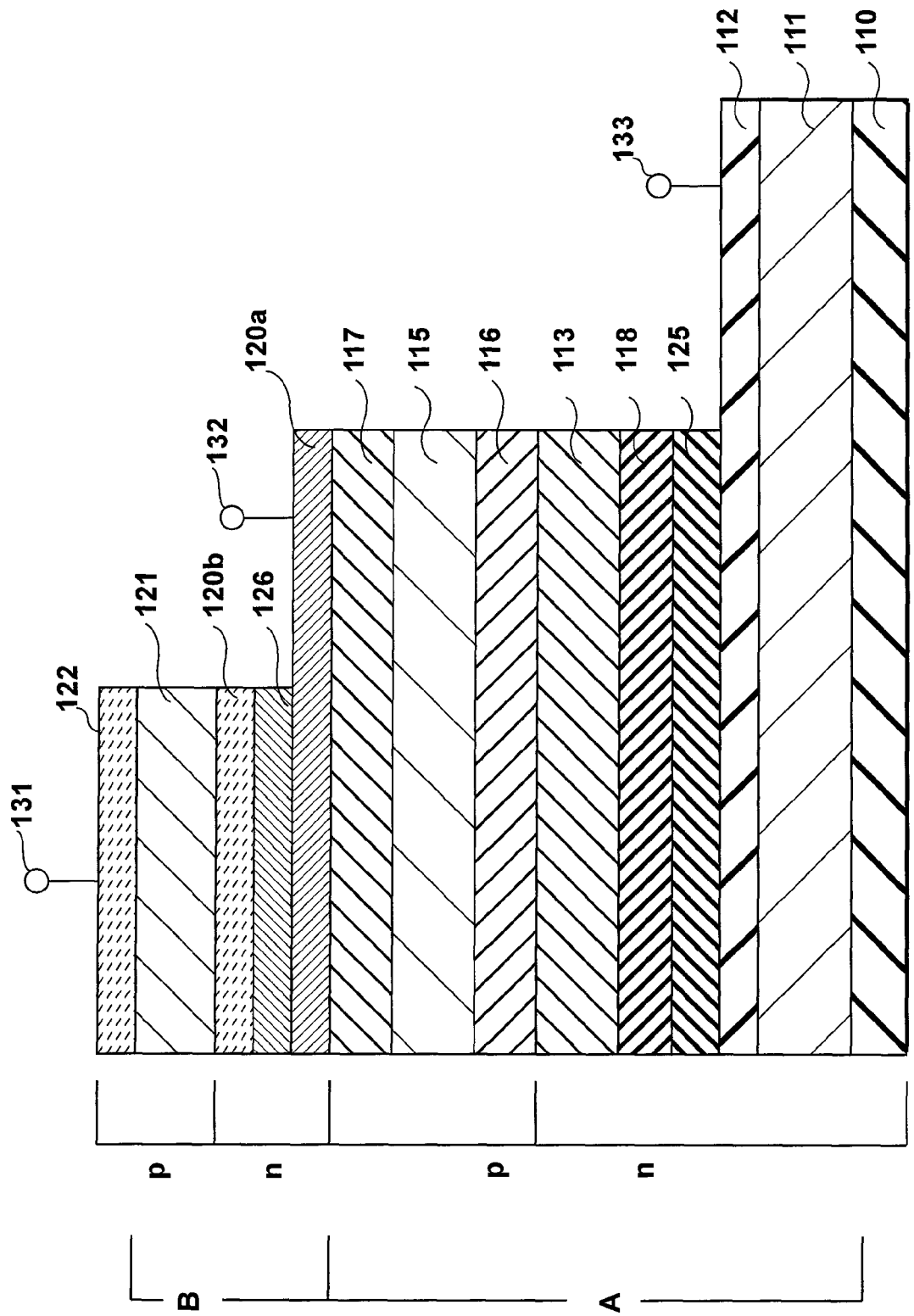
FIG. 12 is a cross-sectional view showing a transformation example (5) in Embodiment 1.

The transformation example (5) is shown in FIG. 12. In transformation example (5), the semiconductor 126 is added to the upper layer of gate contact layer 120a and the semiconductor layer 125 is added to the upper layer of cathode contact layer 112.

The semiconductor layers 117, 118, 125 and 126 mentioned above can be single layer or laminated layer of the material layer, which has band gap larger than the cladding layer, or of the semiconductor layer, containing etching stop layer.

Figure 13:
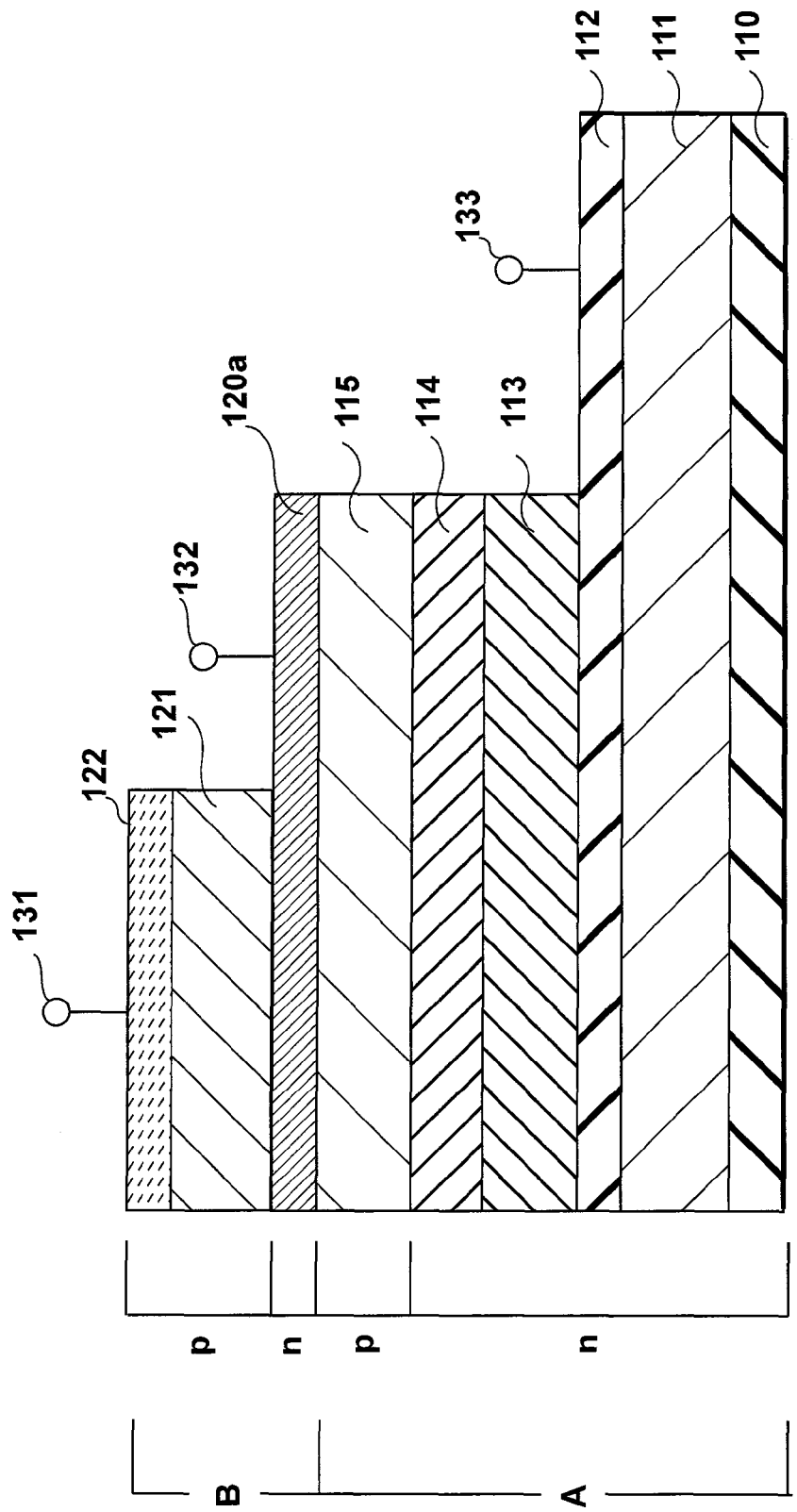
FIG. 13 is a cross-sectional view showing a transformation example (6) in Embodiment 1.

The transformation example (6) is shown in FIG. 13. In transformation example (6), there is only one gate layer, the gate contact layer 120a.

Embodiment 2

Figure 14:
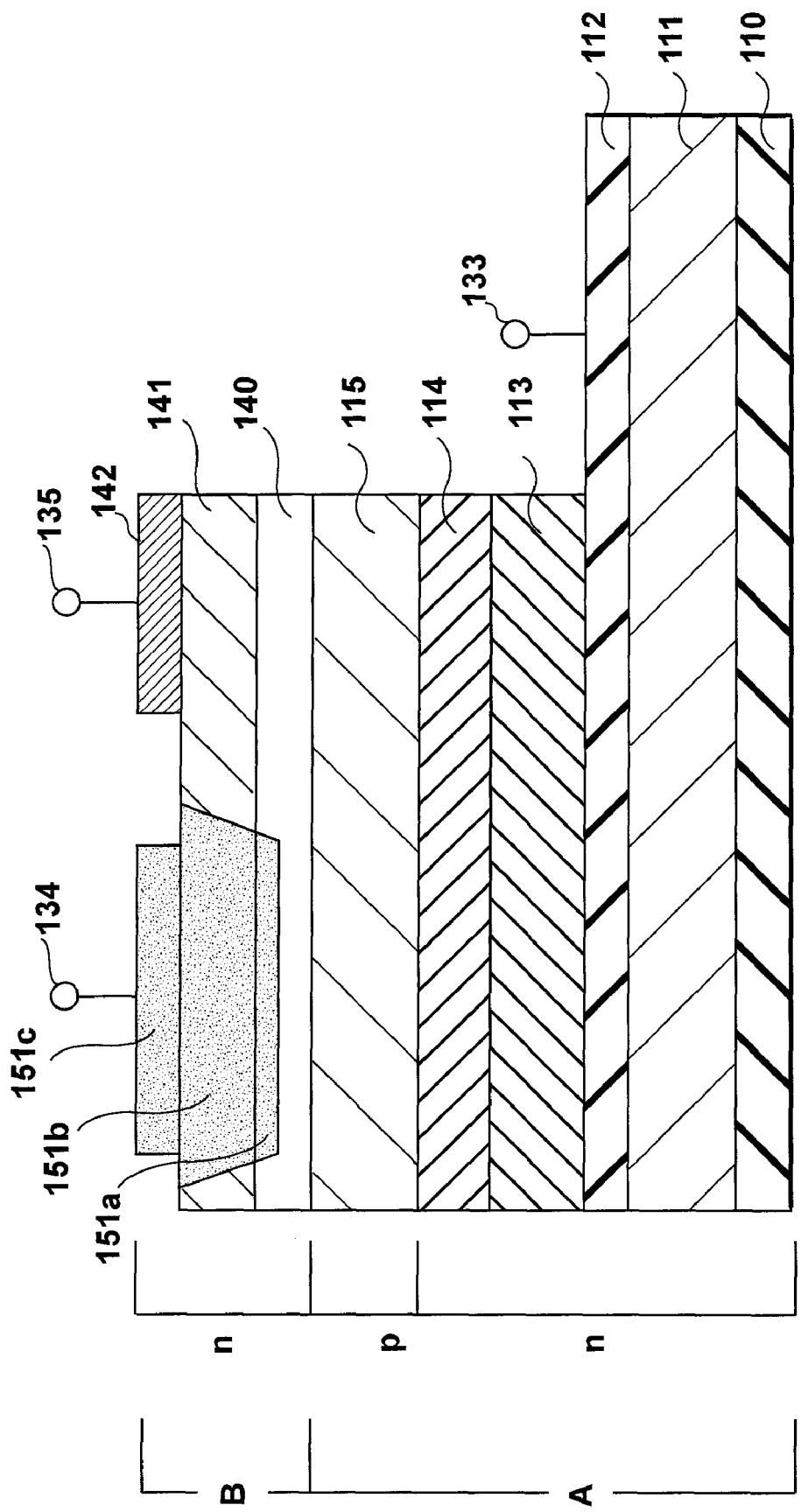
FIG. 14 is a cross-sectional view showing a semiconductor layer structure of a 3-terminal light emitting element in Embodiment 2 of the present invention.

FIG. 14 is a cross-sectional view showing a semiconductor layer of 3-terminal light emitting element in Embodiment 2 of the present invention.

Only the aspects which are different from those in Embodiment 1 will be illustrated hereinafter.

As shown in FIG. 14, "140" represents a gate conduction layer 1; "141" represents a gate conduction layer 2; "142" represents a gate contact layer; "151" represents a impurity diffusion layer, formed selectively; "151a" represents a diffusion region in the gate conduction layer 1; "151b" represents a diffusion region in the gate conduction layer 2; and "151c" represents an anode contact layer (impurity diffusion region in gate contact layer).

In the present invention different structures in Embodiment 2 from those in Embodiment 1 are described hereinafter: both gate contact layer 142 and anode contact layer 151c are set in the semiconductor layer 141; gate conduction layer that set under the gate contact layer 142 and formed by layer 140 and layer 141 with different band gaps; the pn junction formed between anode contact region and anode conduction region, and that formed between anode conduction region and gate conduction layer, comprising the impurity diffusion region 151 which formed selectively on the n-type semiconductor layer; and front part of impurity diffusion 151 formed by the gate conduction layer 140 with smaller band gap.

The semiconductor materials of various kinds can also be used in Embodiment 2, the same with Embodiment 1. The AlGaAs series semiconductor material that easily forms the pn junction through impurity diffusion is illustrated hereinafter.

In FIG. 14, a semiconductor layer 140 (gate conduction layer) is formed by a n-type $Al_uGa_{1-u}As$ layer; a semiconductor layer 141 (gate conduction layer 2) is formed by a n-type $Al_vGa_{1-v}As$ layer; and a semiconductor layer 142 (gate contact layer) is formed by a n-type GaAs layer. Further, the impurity diffusion layer can be formed by Zn diffusion layer.

In this structure, Al mixture crystal ratios of semiconductor layer 140 and 141 (u and v respectively) meets the following condition, u>v. And the band gap of a semiconductor 140 is smaller than that of semiconductor 141. In the configuration of semiconductor layer it is assumed that Al mixture crystal ratio of the semiconductor layer 141 is larger than that of active layer 114 and band gap of semiconductor 114 be larger than that of active layer 114. Further, the material in which the band gap of semiconductor layer 140 being equal to that of active layer 114 or the material used to constitute the indirect movement semiconductor should be selected.

On the basis of the structure mentioned above, the wavelength of the light emitted by the recombination of minority carriers implanted into the gate layer can be selected to be equal to that emitted from the active layer. Or the recombination of carriers in the gate layer can be selected as no light emitting recombination.

Further, in gate conduction layer 140 a distance between front part of diffusion region and gate conduction layer 140 and that between front part of diffusion region and top cladding layer 115 should be smaller than the mean free path of minority carriers implanted into the gate conduction layer (below 200 nm for instance).

Further, a thickness of gate conduction layer 140 should be smaller than a mean free path of minority carriers implanted into the gate conduction layer (below 200 nm, for instance). The impurity density of the semiconductor layer 140 should be lowered (below $1 \times 10^{17}$ cm$^{-3}$).

As for lateral pn junction region formed in semiconductor layer 140, its area should be at least smaller than that of diffusion front end.

The operation of 3-terminal light emitting element in Embodiment 2 is illustrated hereinafter.

In Embodiment 2, carriers are implanted through pn junction formed in the semiconductor layer 140. Due to the higher drop in lateral voltage, when the voltage between anode and cathode increases the longitudinal carrier implantation contrary to the lateral carrier implantation becomes dominant. In this way, the current between anode and cathode increases and the 3-terminal light emitting element shifts to "ON" state.

The same as Embodiment 1, to apply the plus potential to gate electrode 135 and apply anode voltage to anode electrode 134 till 3-terminal light emitting element not shift to "ON" level. Then to lower the gate voltage and the 3-terminal light emitting element will shift to "ON" state. As the carriers implanted laterally into the semiconductor layer 140 recombine in part, anode current will be in a loss. However, as the semiconductor layer 140 is set to be with low doping density, and through expansion of the depleted region in the semiconductor layer 140 and drift of the longitudinal electric field towards the top cladding layer 115, the gate current will be in a slighter loss, and the element can emit light more efficiently.

Further, the methods, such as setting the band gap of the semiconductor 140 be equal to that of active layer 114 or making the non light emitting renewal of bonding become dominant, can be used to prevent the part, renewing bonding in the semiconductor layer 140, from emitting the light with the wavelength different from that of the light emitted from the active layer 114.

In the Embodiment 2 of the invention mentioned above, both a gate contact layer 142 and an anode contact layer 151c are set on the semiconductor layer 141; gate conduction layer that set under the gate contact layer 142 and comprises layer 140 and layer 141 with different band gaps; pn junction formed by the anode contact region and anode conduction region and that formed by the anode conduction region and gate conduction layer comprises the impurity diffusion region 151 formed selectively on the n-type semiconductor layer; and front part of impurity diffusion region 151 comprises the gate conduction layer 140 with the relatively small band gap.

Consequently, in Embodiment 2, the carriers can also be prevented from renewing bonding in the gate contact layer 142, in order to stop the light whose wavelength is not required besides what being achieved in Embodiment 1.

The transformation examples of 3-terminal light emitting element in Embodiment 2 are illustrated hereinafter on the basis of the figures (from FIG. 15 to FIG. 20).

Figure 15:
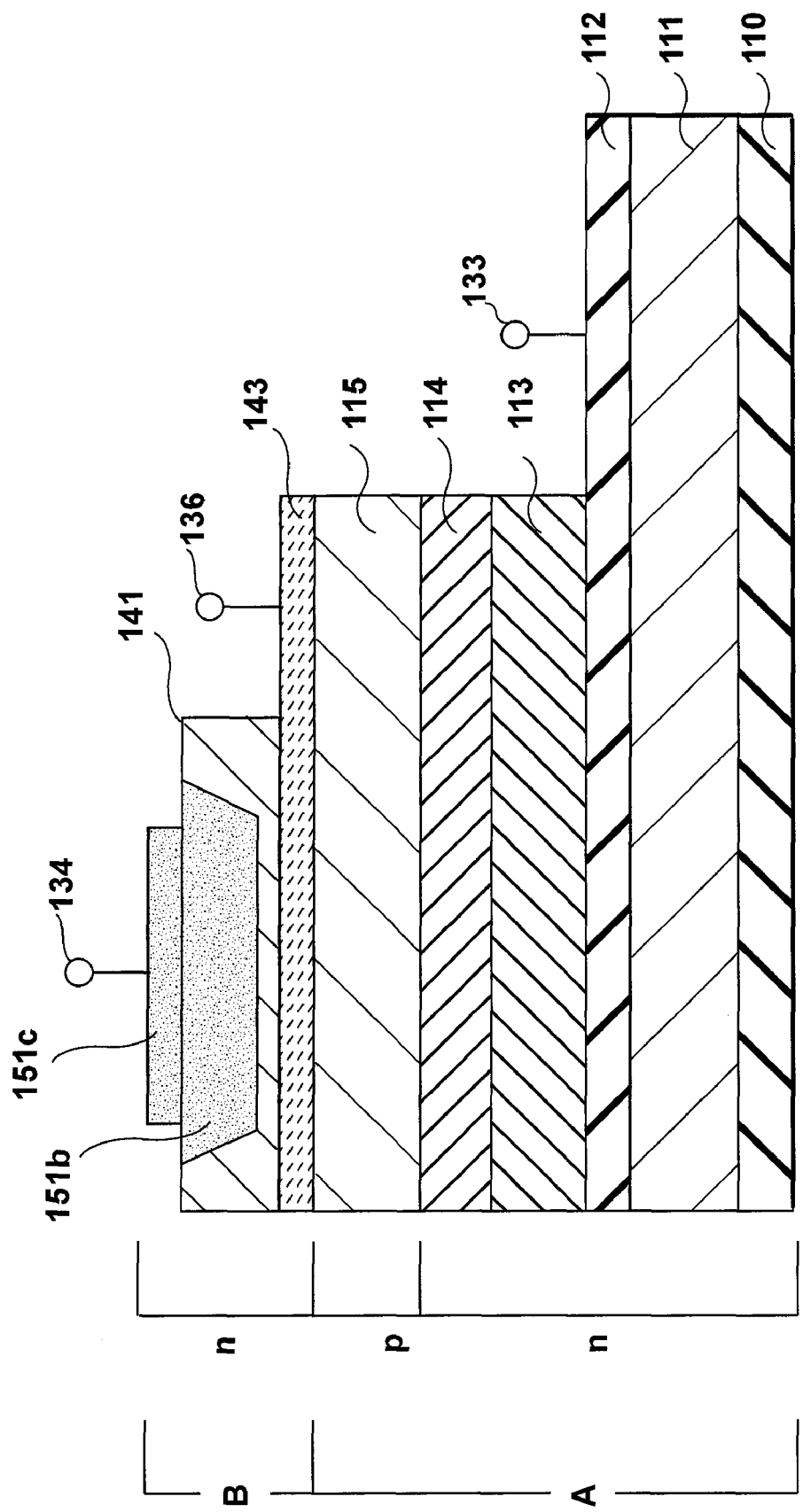
FIG. 15 is a cross-sectional view showing a transformation example (1) in Embodiment 2.

The transformation example (1) is shown in FIG. 15. In transformation example (1), such a structure is adopted that the front part of diffusion region does not reach the semiconductor layer 143.

Figure 16:
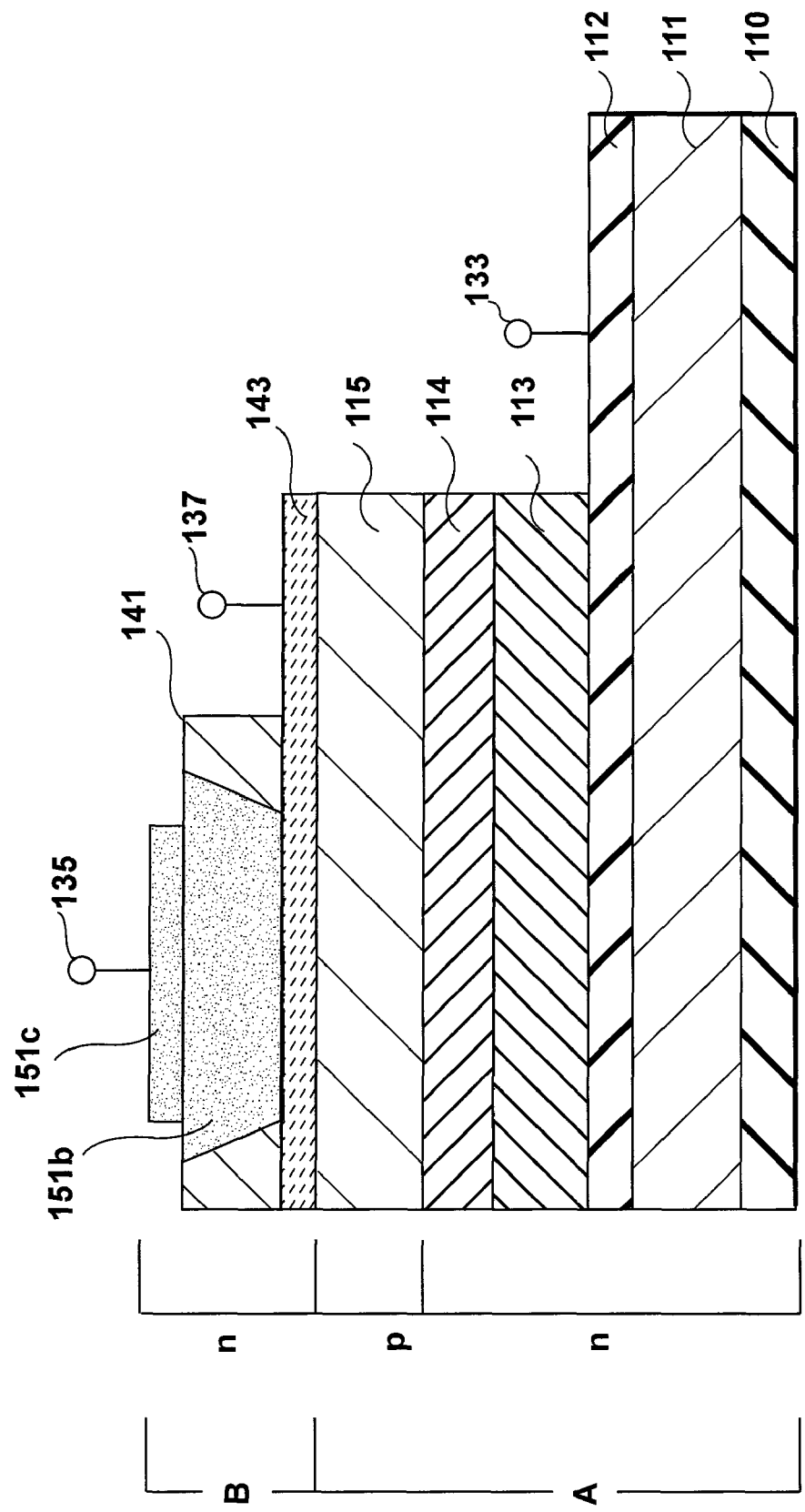
FIG. 16 is a cross-sectional view showing a transformation example (2) in Embodiment 2.

The transformation example (2) is shown in FIG. 16. In transformation example (2), the diffusion front end exists on the interface of the semiconductor 143 and 141.

Figure 17:
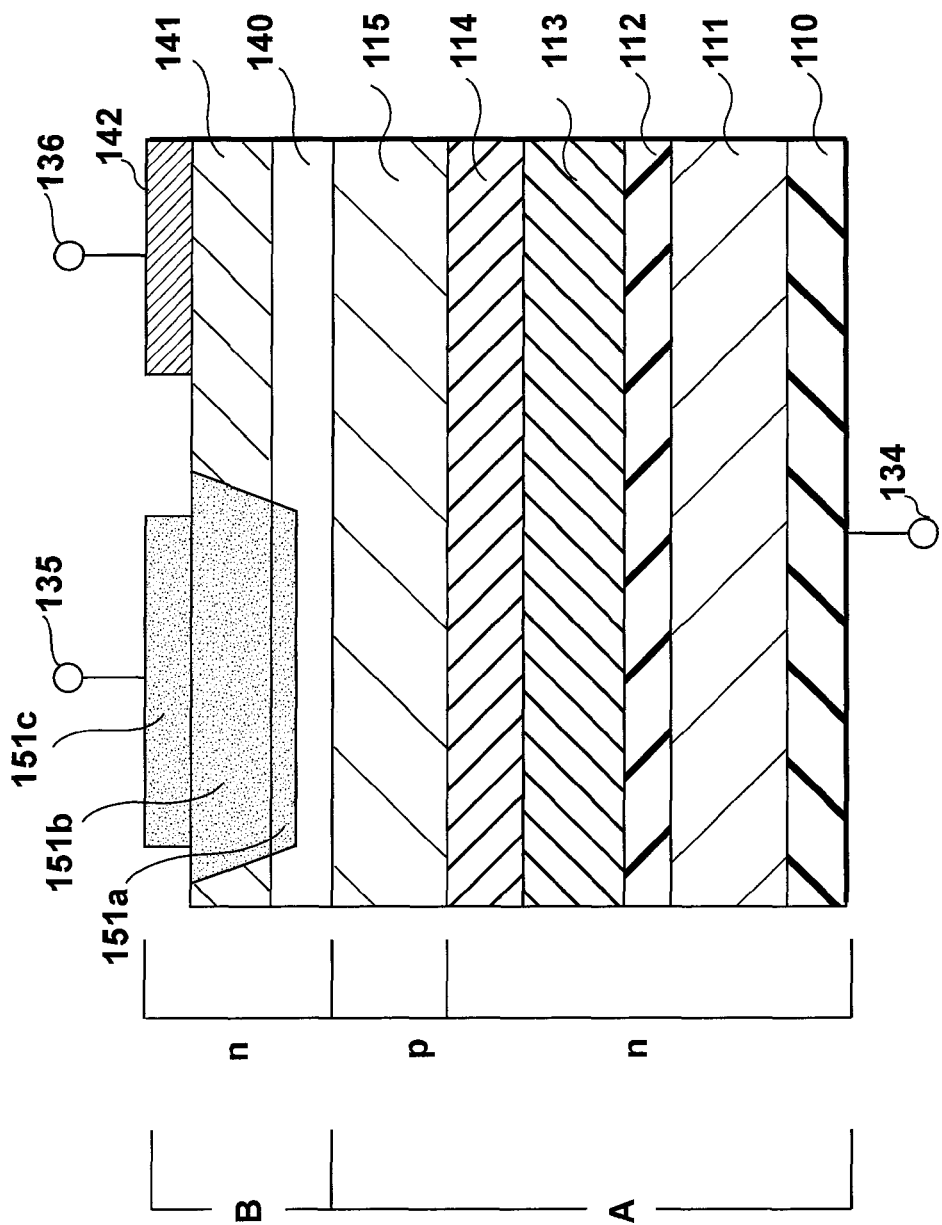
FIG. 17 is a cross-sectional view showing a transformation example (3) in Embodiment 2.
Figure 18:
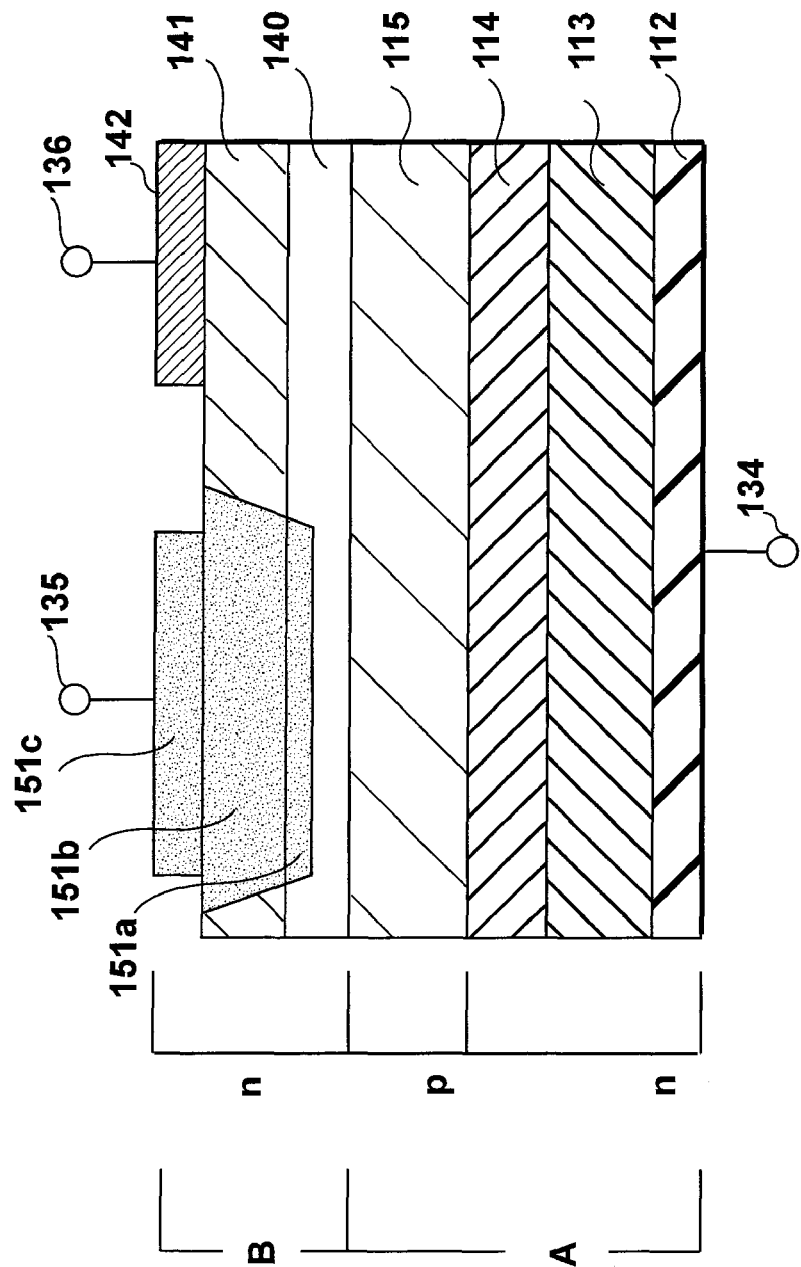
FIG. 18 is a cross-sectional view showing a transformation example (4) in Embodiment 2.

The cathode electrode 134 in the transformation example (3), shown in FIG. 17 and that in transformation example (3), shown in FIG. 18 are set to the inner face of the semiconductor thin layer.

Figure 19:
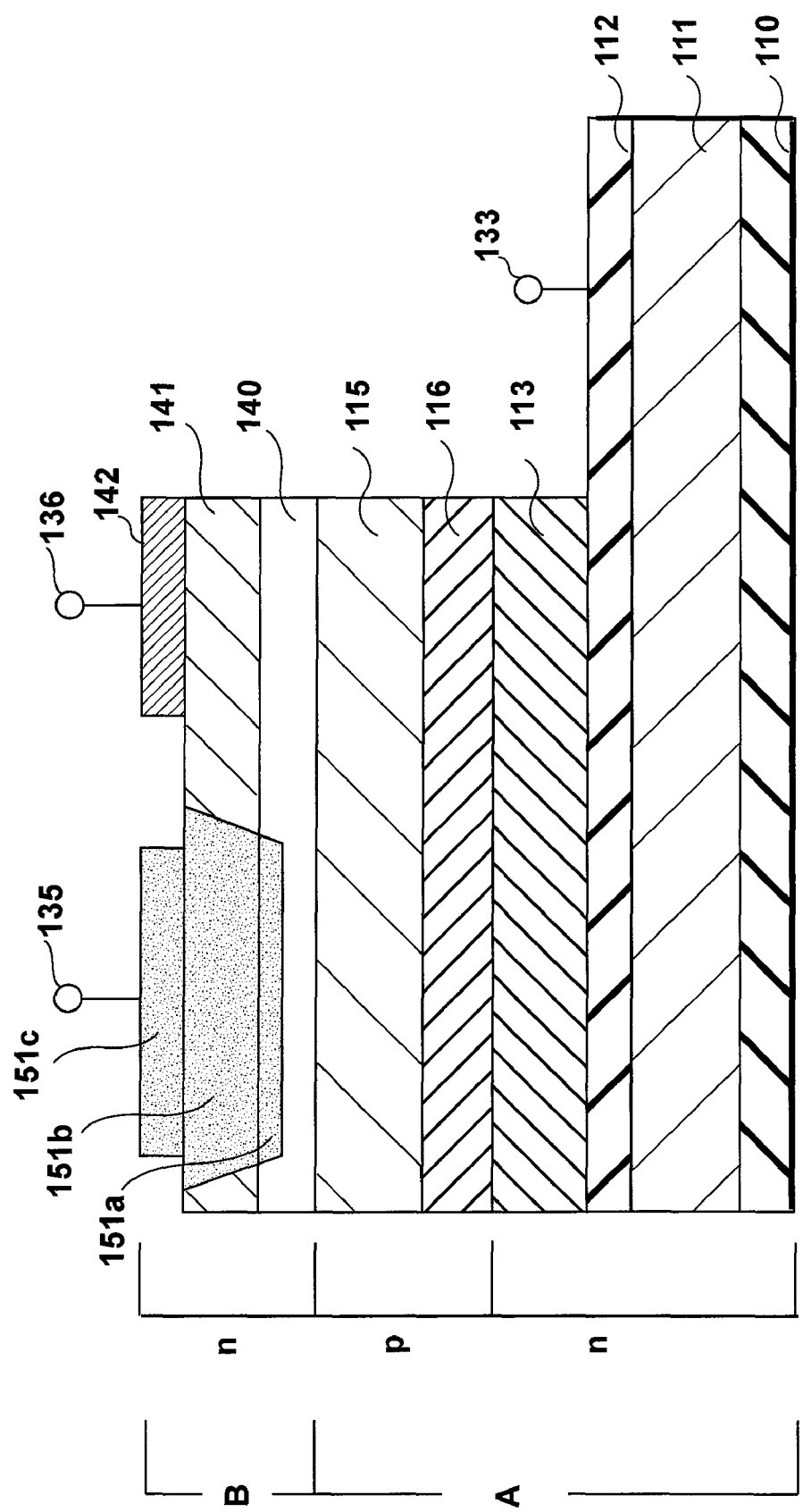
FIG. 19 is a cross-sectional view showing a transformation example (5) in Embodiment 2.

The transformation example (5) is shown in FIG. 19. In transformation example (2), the p-type active layer is set instead of n-type active layer.

Figure 20:
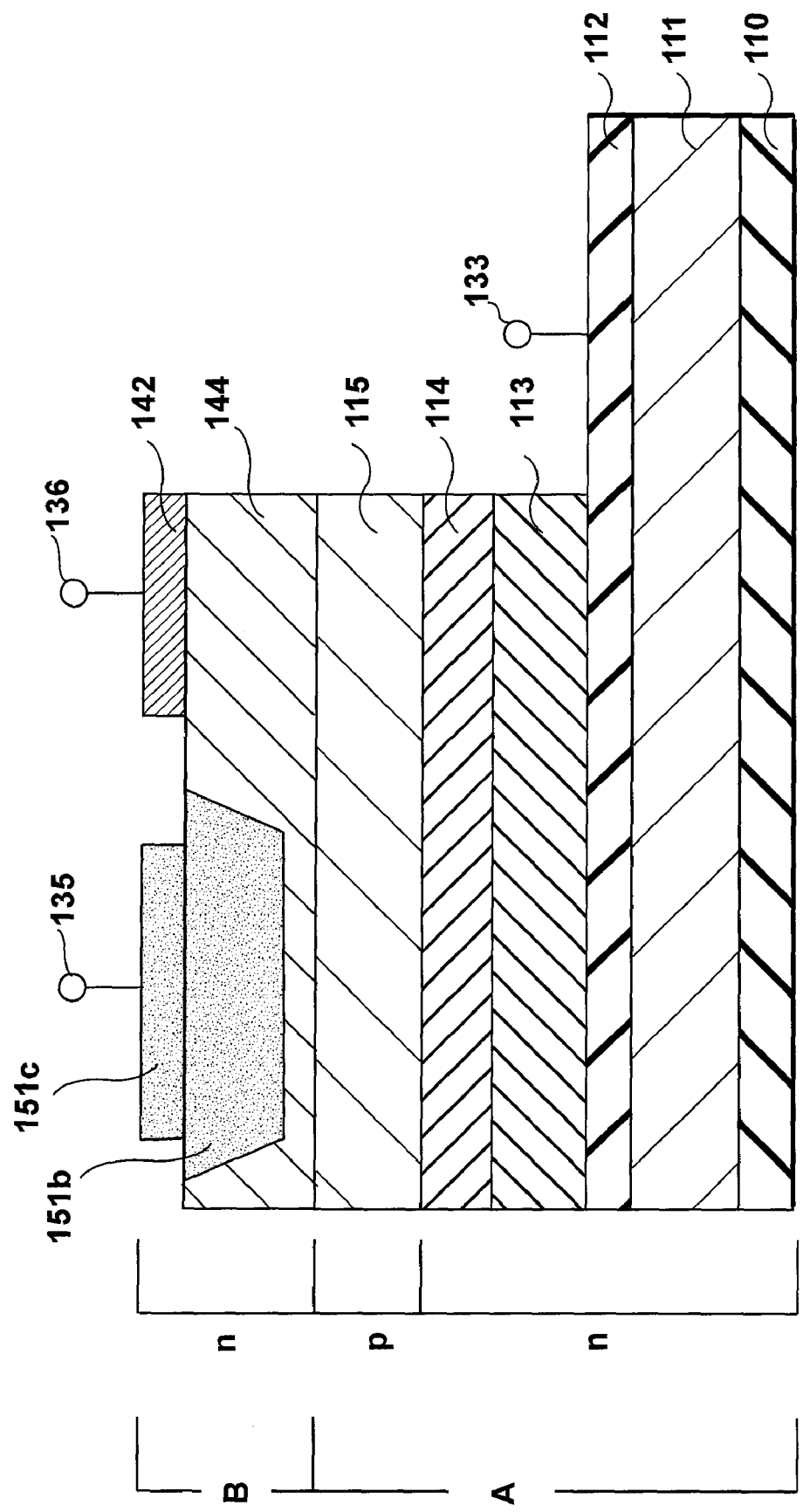
FIG. 20 is a cross-sectional view showing a transformation example (6) in Embodiment 2.

The transformation example (6) is shown in FIG. 20. In transformation example (6), the structure of gate conduction layer 144 is changed to be one layer by making it thinner and reducing the doping quantity.

Embodiment 3

Figure 21:
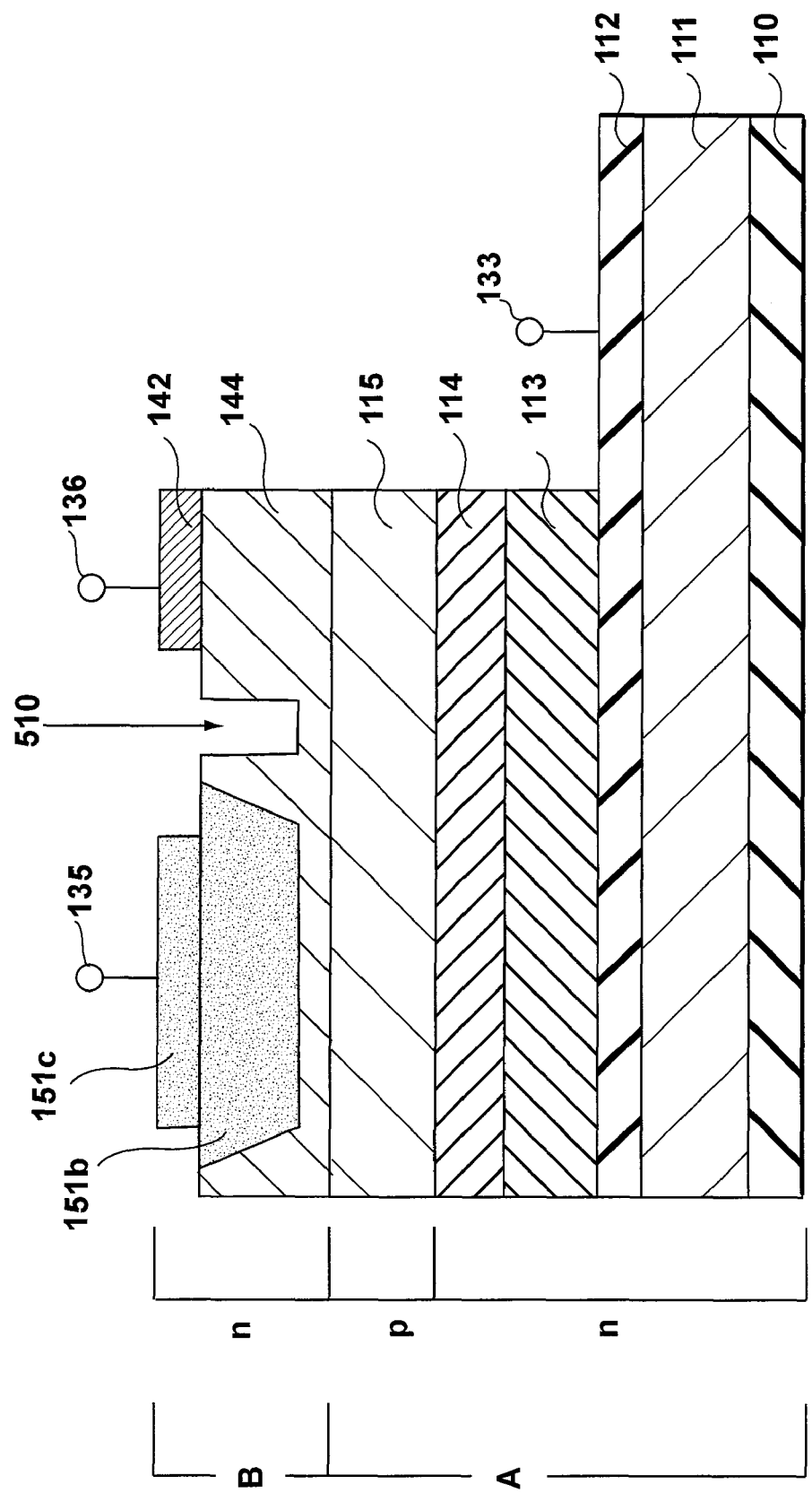
FIG. 21 is a cross-sectional view showing a semiconductor layer structure of a 3-terminal light emitting element in Embodiment 3 of the present invention.

FIG. 21 is a cross-sectional view showing the semiconductor layers of 3-terminal light emitting element in Embodiment 3 of present invention. In Embodiment 3, the same constituents with Embodiment 2 are marked with the same symbol.

The different constituents with Embodiment 2 are illustrated hereinafter.

The Embodiment 3 differs from Embodiment 2 in the present invention in that as shown in FIG. 21 between the under region of gate contact layer 136 and diffusion region 151 sets the channel 510 whose depth being larger than or equal to that of diffusion region.

In Embodiment 3, what the same with Embodiment 2 is that, the semiconductor materials of various kinds can be used. And only the AlGaAs series semiconductor material in which pn junction being easily to be formed through impurity diffusion is illustrated hereinafter.

In FIG. 21, the semiconductor layer 144 (gate conduction layer) is made of n-type Al$_u$Ga$_{1-u}$As layer and the semiconductor layer 142 (gate contact layer) is made of n-type GaAs layer. Further, the impurity diffusion layer can also be Zn diffusion layer.

As for the structures of semiconductor layers, it is assumed that Al mixture crystal ratio of semiconductor layer 144 ($u$) should be larger than that of active layer 114 ($y$) and the band gap the semiconductor layer 144 should be larger than that of active layer 114. Further, the material in which the band gap of semiconductor layer 144 being equal to that of active layer 114 or the material used to constitute the indirect transition semiconductor should be selected.

In addition, the distance between the diffusion front end of the gate conduction layer 144 and the gate conduction layer 144 and that between the gate conduction layer 144 and top cladding layer 115 should be smaller than the mean free path of the minority carriers, implanted into the gate conduction layer 144 (below 200 nm for instance).

Further, the thickness of gate conduction layer 144 should be smaller than the mean free path of minority carriers, implanted into the gate conduction layer (below 200 nm for instance). The impurity density of the semiconductor layer 144 should be lowered (below $1 \times 10^{17}$ cm$^{-3}$).

As for the lateral pn junction region formed in semiconductor layer 144, its area should be at least smaller than that of the diffusion front end.

The operation of 3-terminal light emitting element in Embodiment 3 is illustrated hereinafter.

In Embodiment 3, the voltage applied from the outside of gate contact layer 142 to the gate conduction layer 144 drops in the channel 510 series diffusion region 151. Consequently, in the lateral diffusion region the pn junction related voltage decreases and the carriers are mainly implanted from the diffusion front end (or bottom), not from the lateral side. Other operations are the same with those illustrated in Embodiment 2.

In the Embodiment 3 of the present invention mentioned above, as the diffusion front end sets the channel 510 whose depth is not smaller than that of the diffusion, on the basis of what being achieved in Embodiment 1 and Embodiment 2, a voltage applied from the outside of gate contact layer 142 to the gate conduction layer 144 drops in the channel 510 series diffusion region 151, and then in the lateral diffusion region a pn junction related voltage decreases and carriers are mainly implanted from a diffusion front end (or bottom), not from the lateral side. In this way, the fewer loss of the gate current can be obtained.

The transformation examples of 3-terminal light emitting element in Embodiment 3 are illustrated hereinafter referring to FIG. 22 and FIG. 23.

Figure 22:
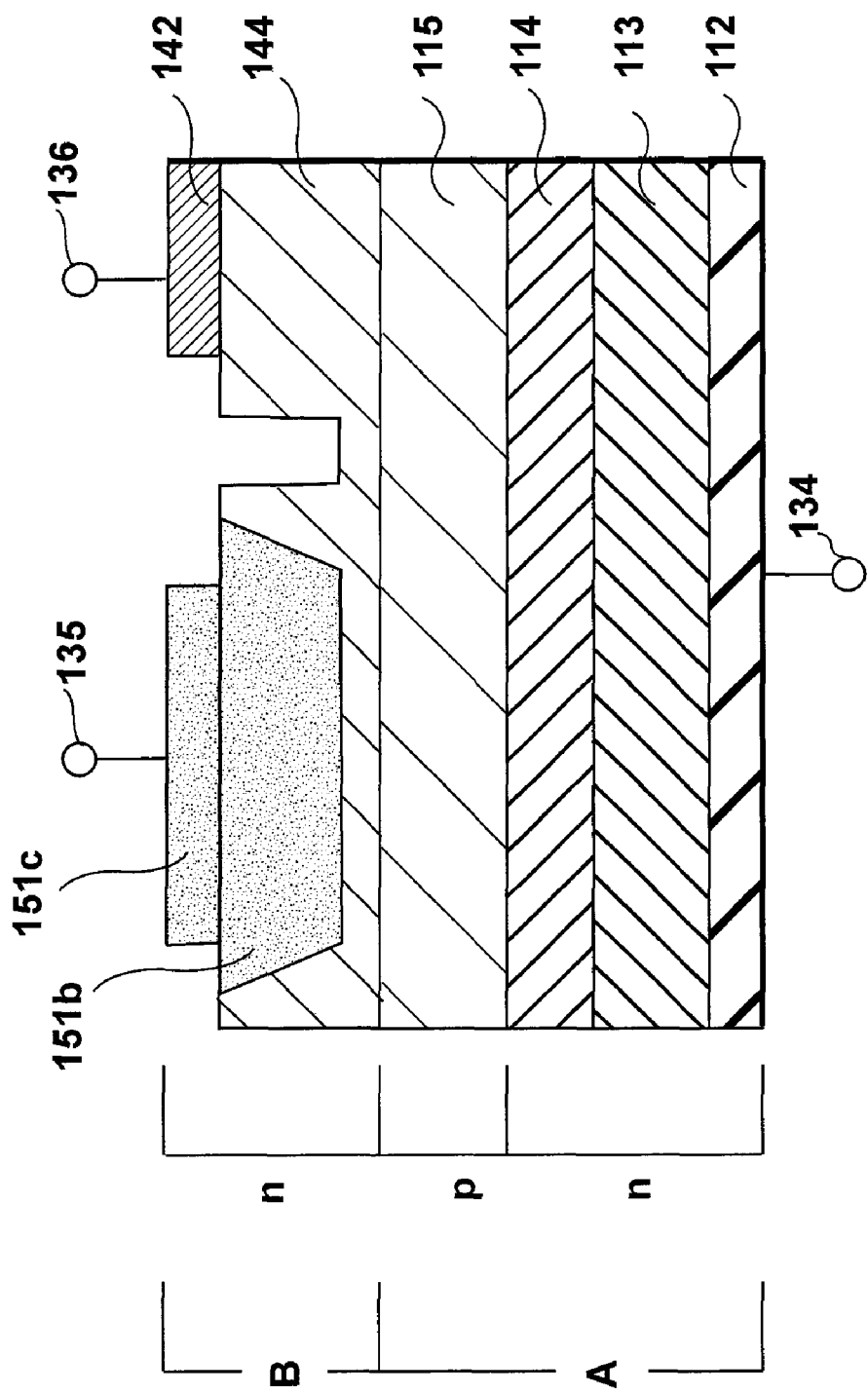
FIG. 22 is a cross-sectional view showing a transformation example (1) in Embodiment 3.

Transformation example (1) is shown in FIG. 22. In transformation example (1), the cathode electrode 134 is set on the inner face of bottom cladding layer 113.

Figure 23:
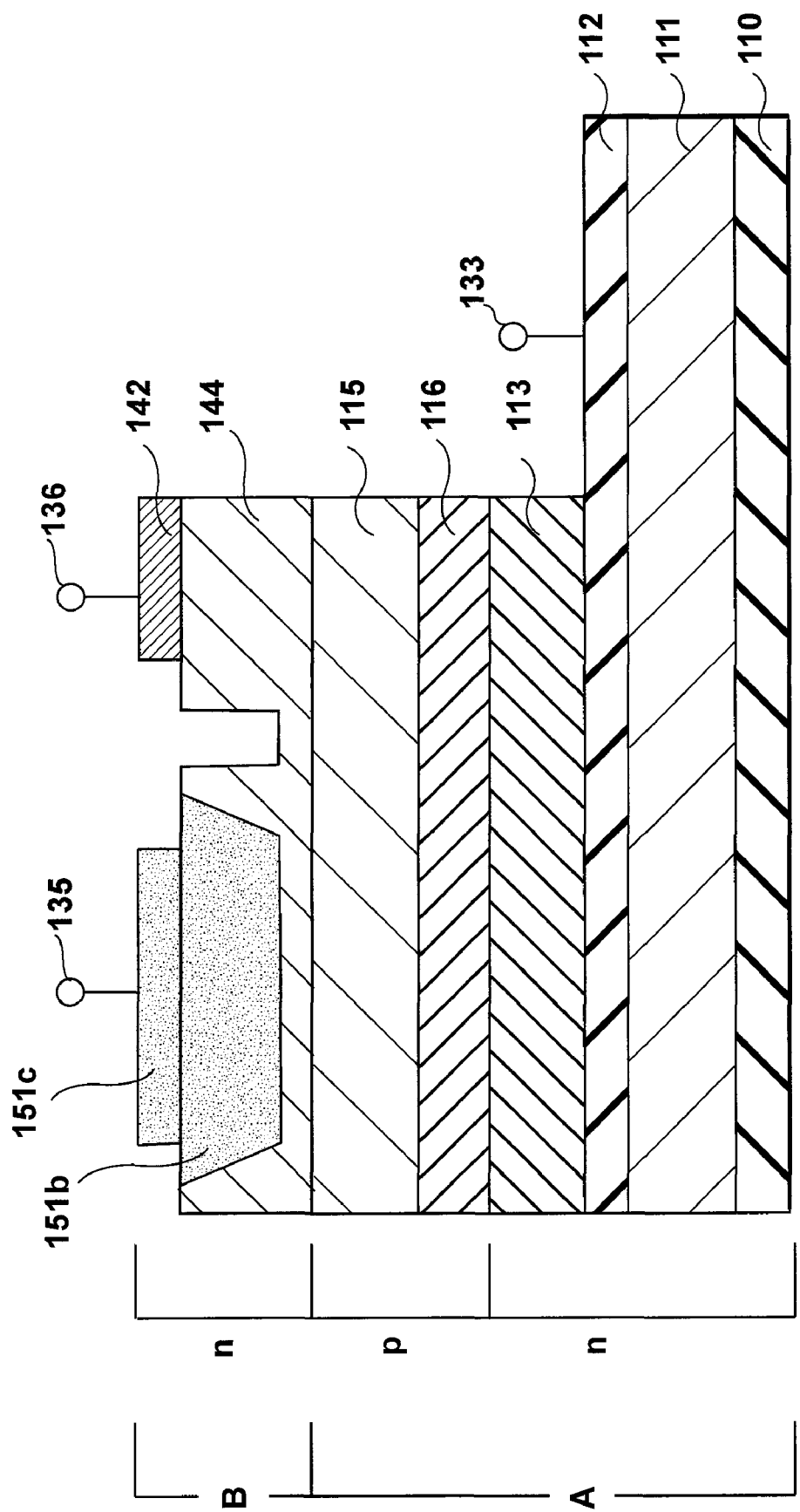
FIG. 23 is a cross-sectional view showing a transformation example (2) in Embodiment 3.

Transformation example (2) is shown in FIG. 23. In transformation example (2) the p-type active layer 116 is used instead of n-type active layer 114.

Embodiment 4

Figure 24:
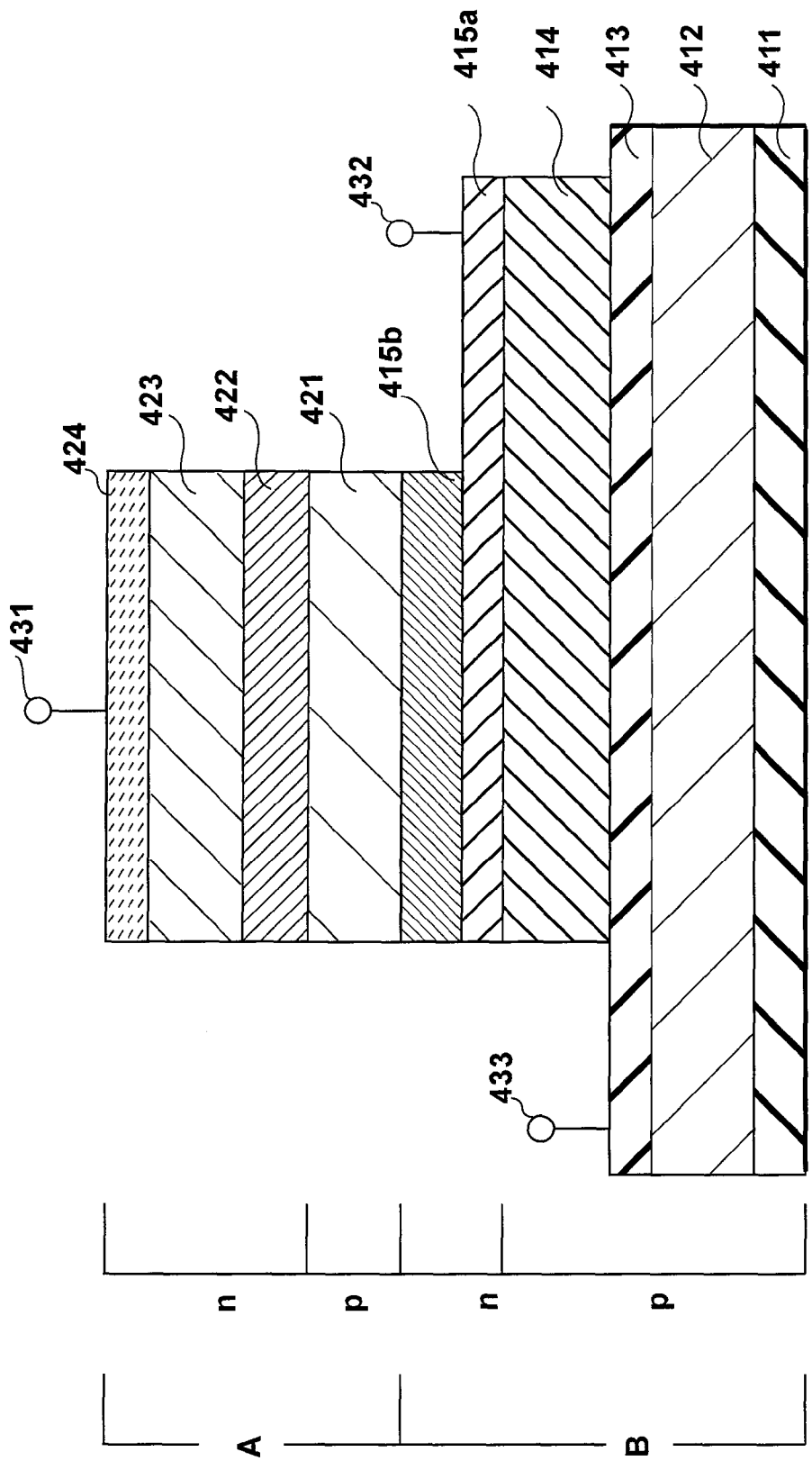
FIG. 24 is a cross-sectional view showing a semiconductor layer structure of 3-terminal light emitting element in Embodiment 4 of the present invention.

FIG. 24 is a cross-sectional view showing semiconductor layers of 3-terminal light emitting element in Embodiment 4 of the present invention.

As shown in FIG. 24, Embodiment 4 differs from Embodiment 1 in the present invention in that in region A and B, the p-type layers and n-type layers are set in the adverse order.

As shown in FIG. 24, "411" represents a p-type junction layer; "412" represents an anode conduction layer; "413" represents an anode contact layer 1; "414" represents an anode conduction layer 2; "415a" represents a n-type gate contact layer; "415b" represents a n-type gate conduction layer; "421" represents a p-type bottom cladding layer; "422" represents a n-type active layer; "423" represents a n-type cladding layer; and "424" represents a cathode contact layer.

Further, "431" represents a cathode electrode; "432" represents a gate electrode; and "433" represents an anode electrode.

What the same with Embodiment 1 is that the semiconductor layers mentioned above can be made of such semiconductor materials as InP series, AlGaAs series, AlInGaP series, nitride series semiconductor materials or the like.

The specific constituents of semiconductor layers when being made of AlGaAs series semiconductor materials are illustrated hereinafter:

As shown in FIG. 24, "411" represents a p-type GaAs layer; "412" represents a p-type $Al_sGa_{1-s}As$ layer; "413" represents p-type GaAs layer; "414" represents a p-type $Al_tGa_{1-t}As$ layer; "415a" represents a n-type GaAs layer; "415b" represents a n-type $Al_uGa_{1-u}As$ layer; "421" represents a p-type $Al_xGa_{1-x}As$ layer; "422" represents a n-type $Al_yGa_{1-y}As$ layer; "423" represents a n-type $Al_zGa_{1-z}As$ layer; and "424" represents a n-type GaAs layer.

In the structure mentioned above, the Al mixture crystal ratio of all AlGaAs layers should meet the following condition: s, t, x, z>y, the constituent of 415 should meet the following condition: u≧y.

Further, the anode electrode 433 and gate electrode 432 should be set in opposite direction, with the active layer region (light emitting region) set between them.

The operation of 3-terminal light emitting element in Embodiment 4 is illustrated hereinafter.

Figure 25:
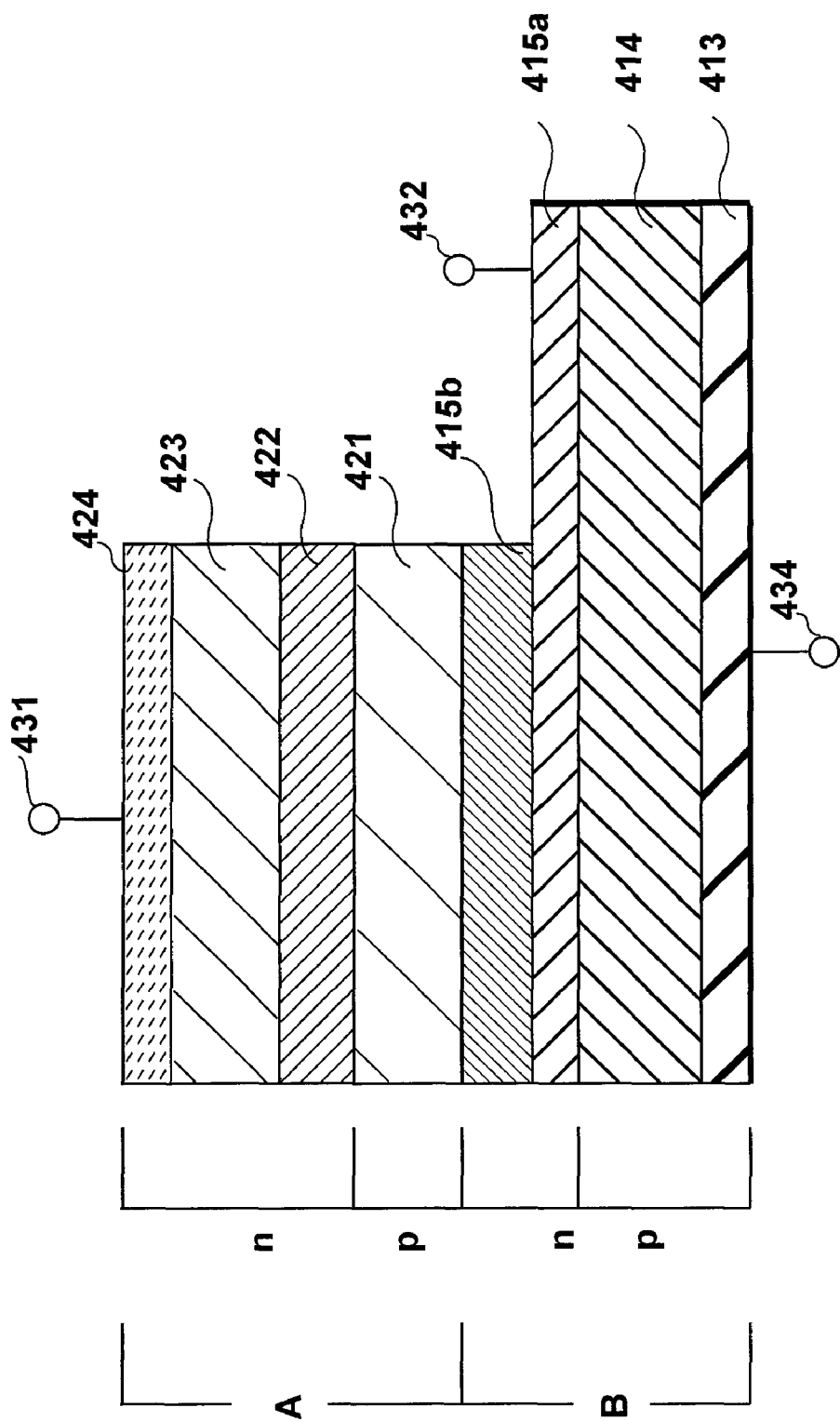
FIG. 25 is a cross-sectional view showing a transformation example (1) in Embodiment 4.

The transformation example (1) is illustrated in FIG. 25. In transformation example (1), the cathode electrode 434 is not set above the semiconductor thin layer, but in its inner face. On this condition, the cathode conduction layer 111 and junction layer 110 can be omitted using the cathode contact layer 1 (112) instead also as a junction layer.

Figure 26:
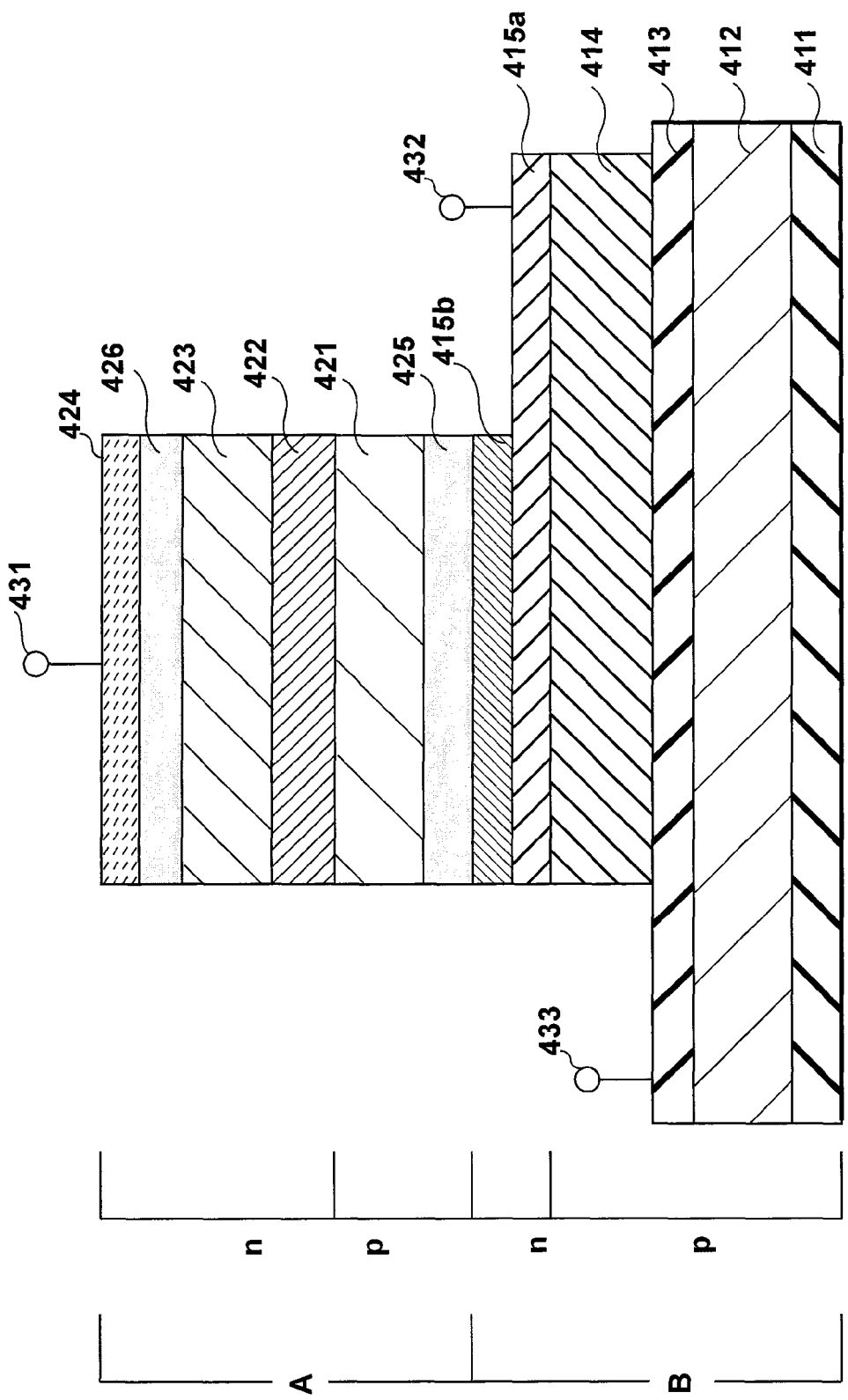
FIG. 26 is a cross-sectional view showing a transformation example (2) in Embodiment 4.

The transformation example (2) is shown in FIG. 26. In transformation example (2), a semiconductor 426 is added to the upper layer of n-type cladding layer 423 and a semiconductor layer 425 is added to an under layer of p-type bottom cladding layer 421. Semiconductor layers 426 and 425 can be single layer or laminated layer of the material layer which has band gap larger than the cladding layer, or of the semiconductor layer containing etching stop layer.

Figure 27:
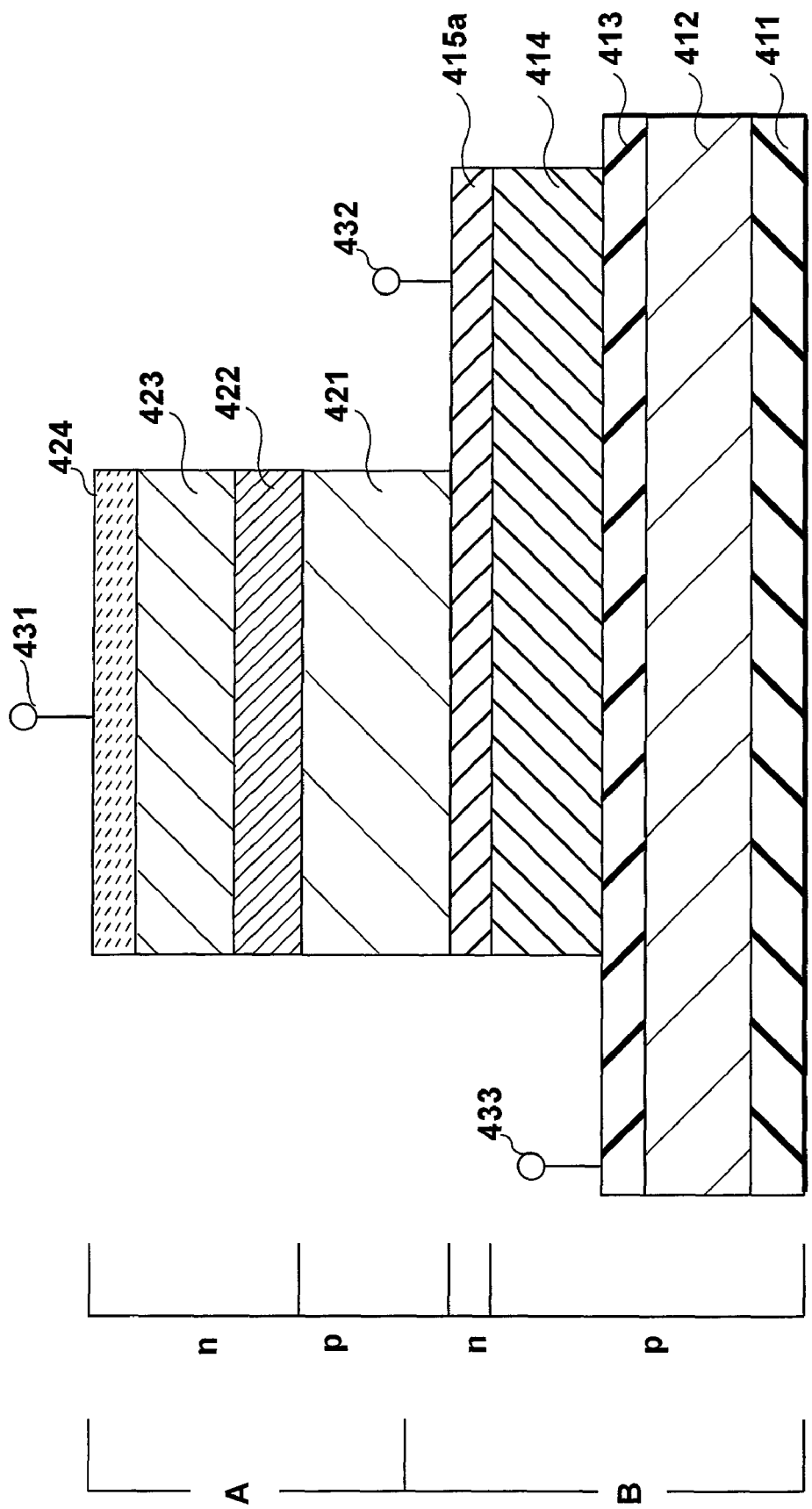
FIG. 27 is a cross-sectional view showing a transformation example (3) in Embodiment 4.

Transformation example (3) is shown in FIG. 27. In transformation example (3), the gate layer is only formed by a n-type contact layer 415a.

Embodiment 5

FIG. 24 is a cross-sectional view showing a semiconductor layer structure of 3-terminal light emitting element in Embodiment 4 of the present invention.

The Embodiment 5 differs from Embodiment 1 in the present invention in structure in that, in Embodiment 1, the layers are laminated following the order, p-type layer/n-type layer/p-type layer/n-type layer and the gate layer is n-type layer. To the contrary, in Embodiment 5, the layers are laminated following the order, n-type layer/p-type layer/n-type layer/p-type and the gate layer is p-type layer.

Figure 28:
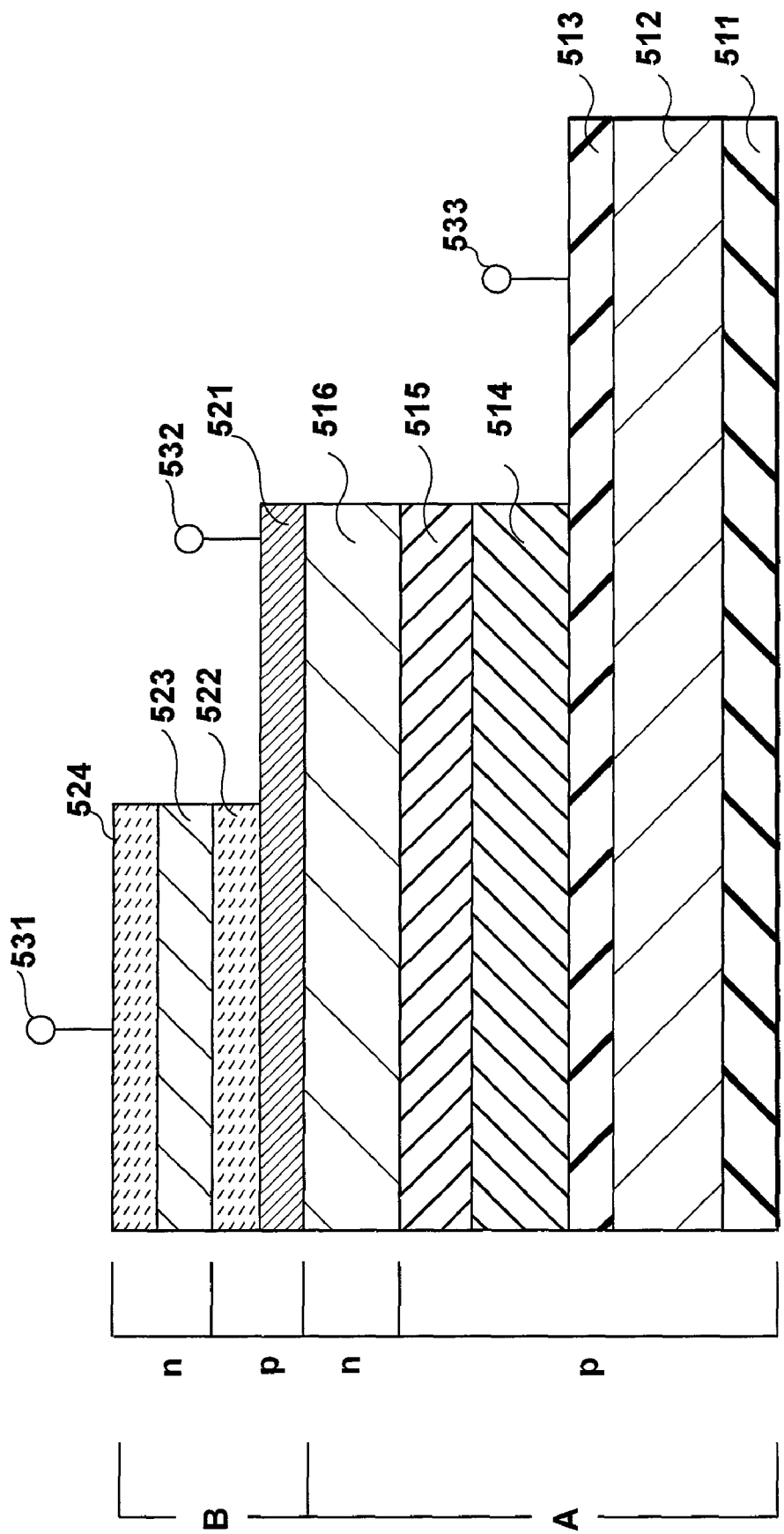
FIG. 28 is a cross-sectional view showing a semiconductor layer structure of a 3-terminal light emitting element in Embodiment 5 of the present invention.

As shown in FIG. 28, "511" represents a junction layer; "512" represents an anode conduction layer; "513" represents an anode contact layer; "514" represents a bottom cladding layer; "515" represents an active layer; "516" represents a top cladding layer; "521" represents a gate contact layer; "522" represents a gate conduction layer; "523" represents a cathode conduction layer; and "524" represents a cathode contact layer;

Further, "531" represents a cathode electrode; "532" represents a gate electrode; and "511" represents an anode electrode.

What the same with Embodiment 1 is that the semiconductor materials of various kinds can also be used here. And only the constituents made of AlGaAs series semiconductor material are illustrated hereinafter.

In FIG. 28, junction layer 511 is formed by a p-type GaAs layer; anode conduction layer 512 is formed by a p-type $Al_sGa_{1-s}As$ layer; anode contact layer 513 is formed by a p-type GaAs layer; bottom cladding layer 514 is formed by a p-type $Al_xGa_{1-x}As$ layer; active layer 515 formed by a p-type $Al_yGa_{1-y}As$ layer; top cladding layer 516 is formed by a n-type $Al_zGa_{1-z}As$ layer; gate contact layer 521 is formed by a p-type GaAs layer; gate conduction layer 522 is formed by a p-type $Al_gGa_{1-g}As$ layer; cathode conduction layer 523 is formed by a n-type $Al_rGa_{1-r}As$ layer; and cathode contact layer 524 is formed by a n-type GaAs layer.

In addition, besides the semiconductor layers mentioned above, the InGaP layer or the like can be set on each contact layer as the etching stop layer used to expose the contact layer.

The gross thickness of gate contact layer 521 and gate conduction layer 522 should be quite thinner (below 200 nm, for instance), and allow the implanted carriers to pass this layer.

Further, the impurity density of gate conduction layer 522 should decrease (lower than $1 \times 10^{17}$ cm$^{-3}$, for instance).

The Al mixture crystal ratio of all layers (x, y, z, s, t) should at least meet the following condition, x, z, s, t>y.

When x, z>y, the carriers implanted into the active layer are closed in this layer; when s, t>y, the different wavelengths can be prevented from be excited because of the light emitting.

As for g, it is better that g≧y. When g=y, even though only part of the minority carriers, implanted into the gate layer, bond for another time, the wavelength of the light emitted because of the bonding of the carriers will also be equal to that emitted in the active layer. Consequently, the narrow wavelength distribution of the light emitting element enables a favorable light emitting characteristic.

Further, as semiconductor layer of g selects its value in the indirect semiconductor material region, even though part of the minority carriers, implanted into the gate layer, renews the bond, the light will not be emitted. Consequently the narrow wavelength distribution of the light emitting element enables a favorable light emitting characteristic.

The operation of 3-terminal light emitting element in Embodiment 5 is illustrated hereinafter.

The 3-terminal light emitting element operates by selecting 531 as its cathode electrode, 432 as its gate electrode and 433 as its anode electrode. The control operations of all electrodes are the same with that in Embodiment 1.

In the Embodiment 5 of the present invention, the gate layer in Embodiment 1 is set to be p-type layer and consequently the minority carriers implanted into the gate layer is more easily to pass. In this way, the 3-terminal light emitting element with more superior electrical and light emitting properties can be achieved.

Figure 29:
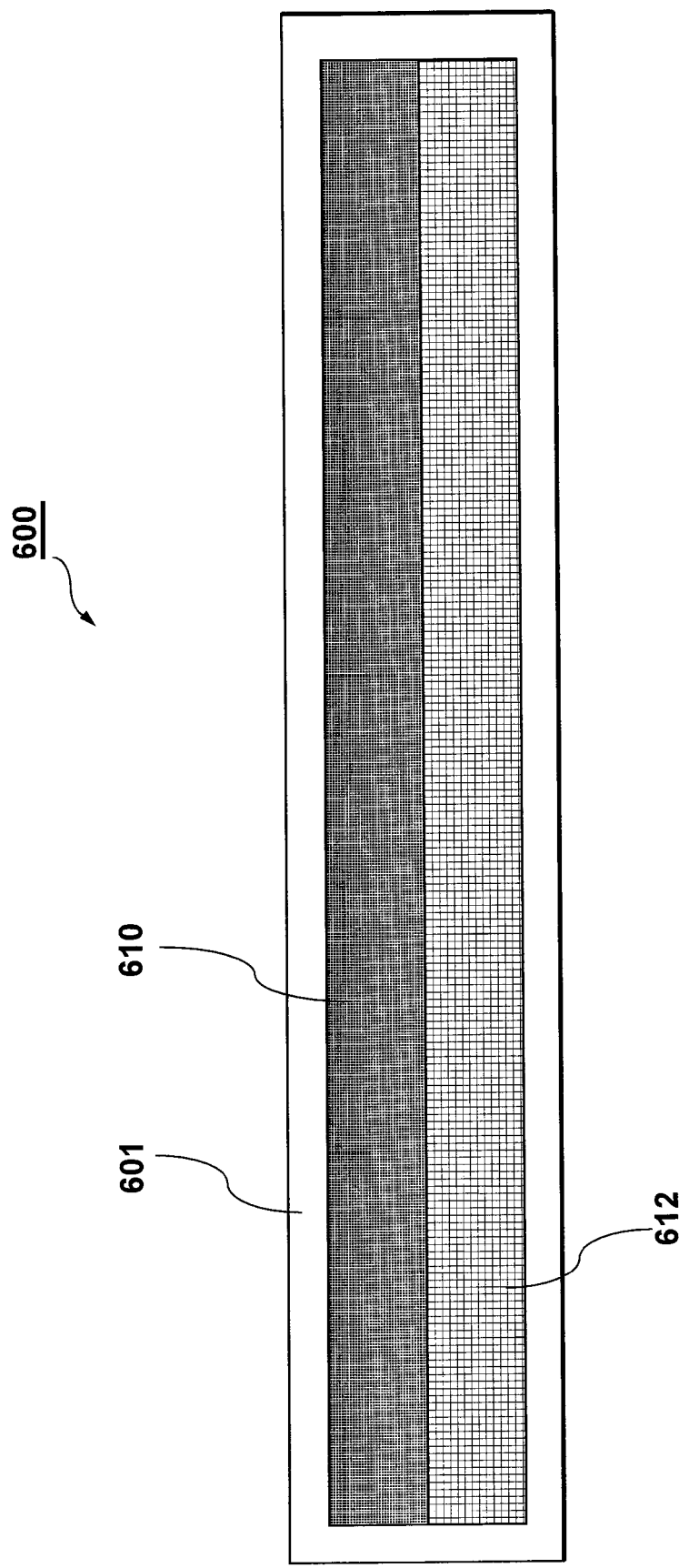
FIG. 29 is a plan view showing an optical print head on the basis of the present invention.

FIG. 29 is a plan view showing an optical print head of the present invention.

As shown in FIG. 29, an optical print head 600 comprises: a 3-terminal light emitting element array 610 made by arranging the several 3-terminal light emitting elements series the Embodiments (from Embodiment 1 to Embodiment 5) in a row; drive element group 612 used to drive the 3-terminal light emitting element array 610; and a substrate 601 used to load 3-terminal light emitting element array 610 and the drive element group 612. The drive element group 612 is used to control operation of each gate of the 3-terminal light emitting element array 610.

Figure 30:
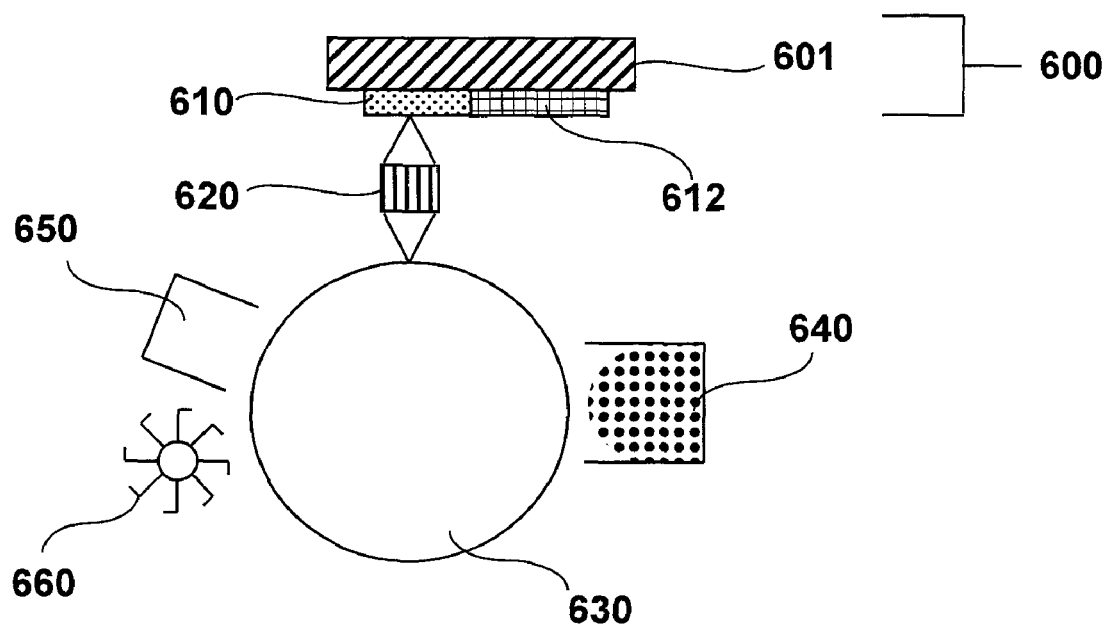
FIG. 30 is a cross-sectional view showing an image forming apparatus on the basis of the present invention.
Figure 31:
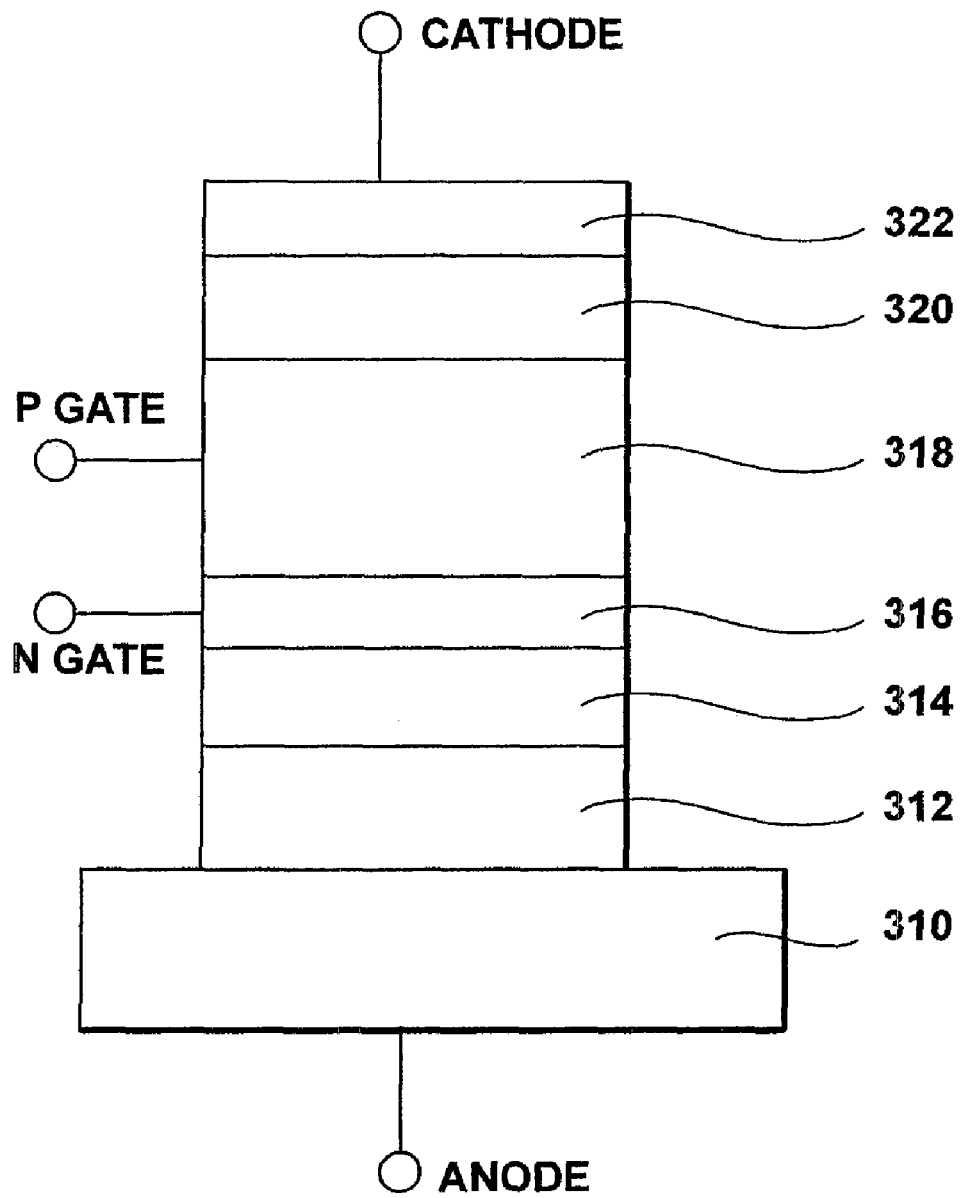
FIG. 31 is a cross-sectional view showing a conventional 3-terminal light emitting element.

FIG. 30 shows a printer as an image forming apparatus in the present invention.

As shown in FIG. 30, the printer is an image forming apparatus, comprising: an optical print head 600; a photosensitive drum (OPC) 630; a lens 620 used to gather the light emitted from the optical print head 600 to the surface of the photosensitive drum 630; a toner developing unit 640; a cleaning system 650 used to clean the toner on the photosensitive drum 630; and a charging unit 660.

In the printer mentioned above, when applying anode voltage to the 3-terminal light emitting element array in the optical print head 600, the drive element 612, on the basis of print data, can control each gate terminal of 3-terminal light emitting element array 610 and thereby control the light emitting operation of each 3-terminal light emitting element.

The light emitted from all the 3-terminal light emitting elements is exposed on the surface of photosensitive drum 630 with minus potential, through the charging unit 660 after being gathered by lens 620.

The charge in the exposed region disappears, and a latent image is formed on the photosensitive drum 630 on the basis of the print data.

The toner developing unit 640 helps the latent image mentioned above adhere to toner, and the image completing adhering to toner can form a toner image on the photosensitive drum 630. Subsequently, the toner image is stenciled to the paper and then the image can be fixed on this paper after heating. In this way, a print image is obtained.

As mentioned above, the printer of the present invention loads optical print head comprising the 3-terminal light emitting element array with high light emitting efficiency to perform print. Therefore, the power required in light exposure can be reduced; and the 3-terminal light emitting element array can be composed of simple element group.

The present invention is not limited to the foregoing embodiments but many modifications and variations are possible within the spirit and scope of the appended claims of the invention.

What is claimed is:

1. A semiconductor light emitting apparatus comprising:
an anode layer;
a cathode layer that has a conductive type different from that of the anode layer;
a gate layer that controls an electrical conduction between the anode layer and the cathode layer, the gate layer having a conductive type different from that of the anode layer;
an active layer that is set between the anode layer and the cathode layer and emits light through recombination of electron and positive hole;
a first cladding layer that is set on one surface of the active layer and has an energy band gap larger than that of the active layer; and
a second cladding layer that is set on other surface of the active layer, has an energy band gap larger than that of the active layer and has a conductive type different from that of the first cladding layer,
wherein a thickness of the gate layer is equal to or below a value of mean free path of minority carriers injected into the gate layer from the anode layer, and
wherein the gate layer is composed of plural semiconductor layers including a first semiconductor layer whose energy band gap is approximately equal to that of the active layer.

2. A semiconductor light emitting apparatus comprising:
an anode layer;
a cathode layer that has a conductive type different from that of the anode layer;
a gate layer that controls an electrical conduction between the anode layer and the cathode layer;
an active layer that is set between the anode layer and the cathode layer and emits light through recombination of electron and positive hole;
a first cladding layer that is set on one surface of the active layer and has an energy band gap larger than that of the active layer; and
a second cladding layer that is set on other surface of the active layer, has an energy band gap larger than that of the active layer and has a conductive type different from that of the first cladding layer, wherein a thickness of the gate layer is equal to or below a value of mean free path of minority carriers injected into the gate layer from the anode layer, wherein the conductive type of a semiconductor layer in which the gate layer is formed is the same as that of a semiconductor layer in which the anode layer is formed, and wherein the gate layer is composed of plural semiconductor layers including a first semiconductor layer whose energy band gap is approximately equal to that of the active layer.

* * * * *